(12) United States Patent
Kim

(10) Patent No.: US 11,361,836 B2
(45) Date of Patent: Jun. 14, 2022

(54) SEMICONDUCTOR MEMORY DEVICE AND METHOD OF OPERATING THE SEMICONDUCTOR MEMORY DEVICE

(71) Applicant: SK hynix Inc., Icheon-si (KR)

(72) Inventor: Jae Woong Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/004,983

(22) Filed: Aug. 27, 2020

(65) Prior Publication Data
US 2021/0304828 A1 Sep. 30, 2021

(30) Foreign Application Priority Data
Mar. 30, 2020 (KR) .......................... 10-2020-0038124

(51) Int. Cl.
| | | |
|---|---|---|
| G11C 29/44 | (2006.01) | |
| G11C 16/34 | (2006.01) | |
| G11C 15/04 | (2006.01) | |
| G11C 16/16 | (2006.01) | |
| G11C 16/08 | (2006.01) | |
| G11C 16/10 | (2006.01) | |
| G11C 16/04 | (2006.01) | |

(52) U.S. Cl.
CPC .......... *G11C 16/349* (2013.01); *G11C 15/046* (2013.01); *G11C 16/0483* (2013.01); *G11C 16/08* (2013.01); *G11C 16/10* (2013.01); *G11C 16/16* (2013.01)

(58) Field of Classification Search
CPC .................................................. G11C 16/349
See application file for complete search history.

(56) References Cited

U.S. PATENT DOCUMENTS

| | | | | |
|---|---|---|---|---|
| 2010/0306579 A1* | 12/2010 | Baek | .................. | G11C 29/4401 |
| | | | | 714/6.12 |
| 2014/0173187 A1* | 6/2014 | Ali | .......................... | G11C 29/82 |
| | | | | 711/103 |
| 2015/0235702 A1* | 8/2015 | Mun | ........................ | G11C 5/02 |
| | | | | 365/49.1 |
| 2017/0125127 A1* | 5/2017 | Kim | .................... | G06F 11/1048 |
| 2020/0151070 A1* | 5/2020 | Lee | ..................... | G06F 11/2094 |

FOREIGN PATENT DOCUMENTS

| | | | |
|---|---|---|---|
| KR | 101624969 B1 | 5/2016 | |
| KR | 1020190093370 A | 8/2019 | |

* cited by examiner

*Primary Examiner* — Min Huang
(74) *Attorney, Agent, or Firm* — William Park & Associates Ltd.

(57) ABSTRACT

The present technology relates to a semiconductor memory device and a method of operating the semiconductor memory device. The semiconductor memory device includes a memory cell array including a plurality of memory blocks, which are assigned as a plurality of normal blocks, a plurality of first replacement blocks, a plurality of second replacement blocks, a first CAM block, and a second CAM block, a peripheral circuit configured to perform an erase operation and a program operation on the plurality of memory blocks, and a control logic configured to control the peripheral circuit to perform a growing bad block check operation on a target block during the program operation on a selected target block among the normal memory blocks.

16 Claims, 12 Drawing Sheets

SEMICONDUCTOR MEMORY DEVICE AND METHOD OF OPERATING THE SEMICONDUCTOR MEMORY DEVICE

CROSS-REFERENCE TO RELATED APPLICATION

The present application claims priority under 35 U.S.C. § 119(a) to Korean patent application number 10-2020-0038124, filed on Mar. 30, 2020, in the Korean Intellectual Property Office, the entire disclosure of which is incorporated herein by reference.

BACKGROUND

1. Technical Field

The present disclosure relates to an electronic device, and more particularly, to a semiconductor memory device and a method of operating the semiconductor memory device.

2. Related Art

Recently, a paradigm for a computer environment has been transformed into ubiquitous computing, which enables a computer system be used whenever and wherever. Therefore, a use of a portable electronic device such as a mobile phone, a digital camera, and a notebook computer is rapidly increasing. Such a portable electronic device generally uses a memory system that uses a semiconductor memory device, that is, a data storage device. The data storage device is used as a main storage device or an auxiliary storage device of the portable electronic device.

The semiconductor data storage device using the memory device has advantages of stability and durability which are excellent because there is no mechanical driver, an access speed of information is very fast, and power consumption is low. As an example of the memory system having such advantages, a data storage device includes a universal serial bus (USB) memory device, a memory card having various interfaces, a solid state drive (SSD), and the like.

A memory device is largely divided into a volatile memory device and a non-volatile memory device.

A writing speed and a reading speed of the non-volatile memory device are relatively slow, however, the non-volatile memory device maintains storage data even though power supply is shut off. Therefore, a non-volatile memory device is used to store data to be maintained regardless of power supply. A non-volatile memory device includes a read only memory (ROM), a mask ROM (MROM), a programmable ROM (PROM), an erasable programmable ROM (EPROM), an electrically erasable programmable ROM (EEPROM), a flash memory, a phase change random access memory (PRAM), a magnetic RAM (MRAM), a resistive RAM (RRAM), a ferroelectric RAM (FRAM), and the like. The flash memory is divided into a NOR type and a NAND type.

SUMMARY

A semiconductor memory device according to an embodiment of the present disclosure may include a memory cell array including a plurality of memory blocks, which are assigned as a plurality of normal blocks, a plurality of first replacement blocks, a plurality of second replacement blocks, a first CAM block, and a second CAM block, a peripheral circuit configured to perform an erase operation and a program operation on the plurality of memory blocks, and a control logic configured to control the peripheral circuit to perform a growing bad block check operation on a target block during the program operation on a selected target block among the normal memory blocks.

A semiconductor memory device according to an embodiment of the present disclosure may include a memory cell array including a plurality of normal blocks, a plurality of replacement blocks, and a CAM block, a peripheral circuit configured to perform an erase operation and a program operation on the plurality of memory blocks, a word line test circuit configured to detect a defect of local lines connected to the plurality of memory blocks, and a control logic configured to control the peripheral circuit to perform a growing bad block check operation on the target block during the program operation on a selected target block among the normal memory blocks, and the control logic may control the peripheral circuit to perform the program operation on a selected replacement block among the plurality of replacement blocks instead of the target block according to a result of the growing bad block check operation.

A method of operating a semiconductor memory device according to an embodiment of the present disclosure may include receiving a command corresponding to a program operation on a target block, performing an erase operation on the target block in response to the command, performing a growing bad block check operation on the target block after the erase operation is completed, and selecting a replacement block for replacing the target block and performing the program operation when the target block is determined as a growing bad block as a result of the growing bad block check operation.

DETAILED DESCRIPTION

Specific structural or functional descriptions of embodiments according to the concept which are disclosed in the present specification or application are illustrated only to describe the embodiments according to the concept of the present disclosure. The embodiments according to the concept of the present disclosure may be carried out in various forms and the descriptions are not limited to the embodiments described in the present specification or application.

Hereinafter, embodiments of the present disclosure will be described with reference to the accompanying drawings, so that those skilled in the art to which the present disclosure pertains may easily carry out the technical spirit of the present disclosure.

An embodiment of the present disclosure provides a semiconductor memory device capable of detecting growing bad blocks among memory blocks included in a semiconductor memory device, and a method of operating the same.

According to the present technology, the program operation may be performed by detecting the growing bad blocks among the memory blocks included in the memory device and replacing the detected growing bad blocks with the replacement block. Therefore, stability of a memory system may be improved. In addition, the growing bad block check operation and a replacement block selection operation may be performed by itself in a semiconductor memory without receiving a command from the outside.

Figure 1:
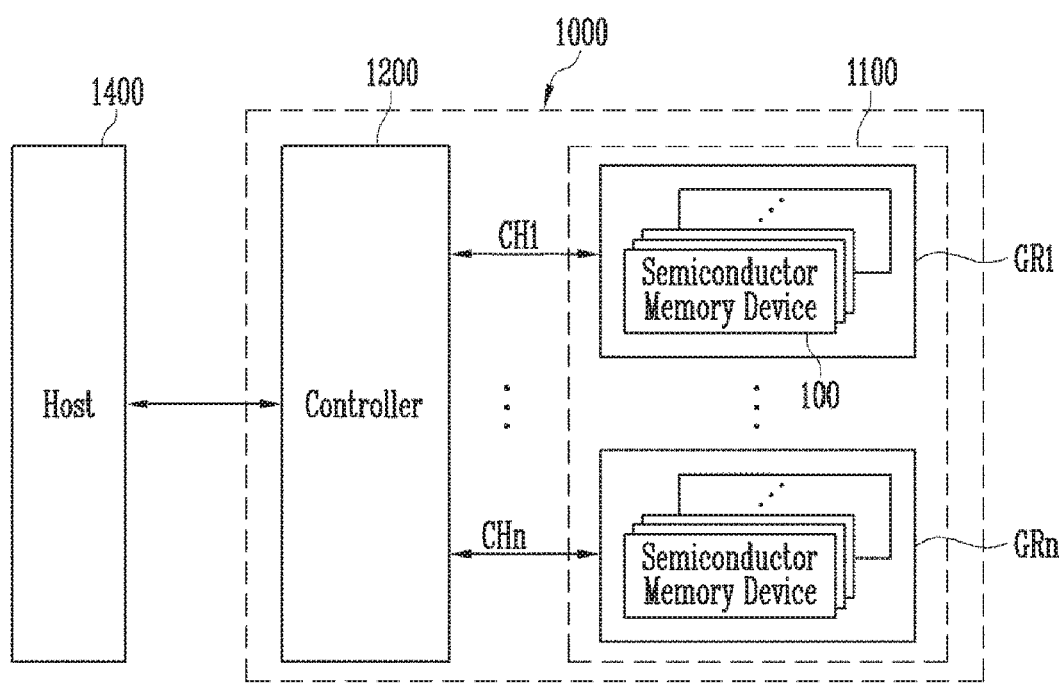
FIG. 1 is a block diagram for describing a memory system according to an embodiment of the present disclosure.

FIG. 1 is a block diagram for describing a memory system according to an embodiment of the present disclosure.

Referring to FIG. 1, the memory system 1000 includes a memory device 1100 and a controller 1200. The memory device 1100 includes a plurality of semiconductor memory devices 100. The plurality of semiconductor memory devices 100 may be divided into a plurality of groups GR1 to GRn.

In FIG. 1, the plurality of groups GR1 to GRn communicates with the controller 1200 through first to n-th channels CH1 to CHn, respectively. Each semiconductor memory device 100 will be described later with reference to FIG. 2.

Each of the plurality of groups GR1 to GRn is configured to communicate with the controller 1200 through one common channel. The controller 1200 is configured to control the plurality of semiconductor memory devices 100 of the memory device 1100 through a plurality of channels CH1 to CHn. Each of the semiconductor memory devices 100 may include a plurality of memory blocks, perform a growing bad block (GBB) check operation on a selected target block before performing a program operation, and may perform the program operation by replacing the target block with a replacement block according to a result of the GBB check operation.

When manufacturing is completed, the semiconductor memory device 100 performs a test process to check a manufacturing status, performance, reliability, and the like of a memory element. Even though the semiconductor memory device 100 passes the test process, a defect or a fault may occur in a subsequent use process. The defect or fault occurring in the use process is referred to as a growing defect or a growing fault, and a memory block in which the growing defect occurs is referred to as a growing bad block (GBB). In addition, after the manufacturing of the semiconductor memory device 100 is completed, a bad memory block detected in the above-described test process may be defined as an initial bad block. In addition, a memory block in which status fail occurs as a result of various operations, for example, a program operation, a read operation, and an erase operation, may be defined as a bad block. In an embodiment of the present disclosure, a GBB may be detected by performing the GBB check operation on the target block before the program operation of the target block.

The controller 1200 is connected between a host 1400 and the memory device 1100. The controller 1200 is configured to access the memory device 1100 in response to a request from the host 1400. For example, the controller 1200 is configured to control read, write, erase, and background operations of the memory device 1100 in response to the request received from the host 1400. The controller 1200 is configured to provide an interface between the memory device 1100 and the host 1400. The controller 1200 is configured to drive firmware for controlling the memory device 1100.

The host 1400 controls the memory system 1000. The host 1400 includes a portable electronic device such as a computer, a PDA, a PMP, an MP3 player, a camera, a camcorder, and a mobile phone. The host 1400 may request a write operation, a read operation, an erase operation, and the like of the memory system 1000 through a command.

The controller 1200 and the memory device 1100 may be integrated into one semiconductor device. As an example of an embodiment, the controller 1200 and the memory device 1100 may be integrated into one semiconductor device to form a memory card. For example, the controller 1200 and the memory device 1100 may be integrated into one semiconductor device to form a memory card such as a PC card (personal computer memory card international association (PCMCIA)), a compact flash card (CF), a smart media card (SM or SMC), a memory stick, a multimedia card (MMC, RS-MMC, or MMCmicro), an SD card (SD, miniSD, microSD, or SDHC), and a universal flash memory (UFS).

The controller 1200 and the memory device 1100 may be integrated into one semiconductor device to form a semiconductor drive (solid state drive (SSD)). The semiconductor drive (SSD) includes a storage device configured to store data in a semiconductor memory. When the memory system 1000 is used as the semiconductor drive (SSD), an operation speed of the host 1400 connected to the memory system 1000 may be dramatically improved.

As another example, the memory system 1000 is provided as one of various components of an electronic device such as a computer, an ultra-mobile PC (UMPC), a workstation, a net-book, a personal digital assistants (PDA), a portable computer, a web tablet, a wireless phone, a mobile phone, a smart phone, an e-book, a portable multimedia player (PMP), a portable game machine, a navigation device, a black box, a digital camera, a 3-dimensional television, a digital audio recorder, a digital audio player, a digital picture recorder, a digital picture player, a digital video recorder, and a digital video player, a device capable of transmitting and receiving information in a wireless environment, one of various electronic devices configuring a home network, one of various electronic devices configuring a computer network, one of various electronic devices configuring a telematics network, an RFID device, or one of various components configuring a computing system.

As an example of an embodiment, the memory device 1100 or memory system 1000 may be mounted as a package of various types. For example, the memory device 1100 or the memory system 1000 may be packaged and mounted in a method such as a package on package (PoP), ball grid arrays (BGAs), chip scale packages (CSPs), plastic leaded chip carriers (PLCC), a plastic dual in line package (PDIP), a die in waffle pack, die in wafer form, a chip on board (COB), a ceramic dual in line package (CERDIP), a plastic metric quad flat pack (MQFP), a thin quad flat pack (TQFP), a small outline (SOIL), a shrink small outline package (SSOP), a thin small outline (TSOP), a system in package (SIP), a multi-chip package (MCP), a wafer-level fabricated package (WFP), or a wafer-level processed stack package (WSP).

Figure 2:
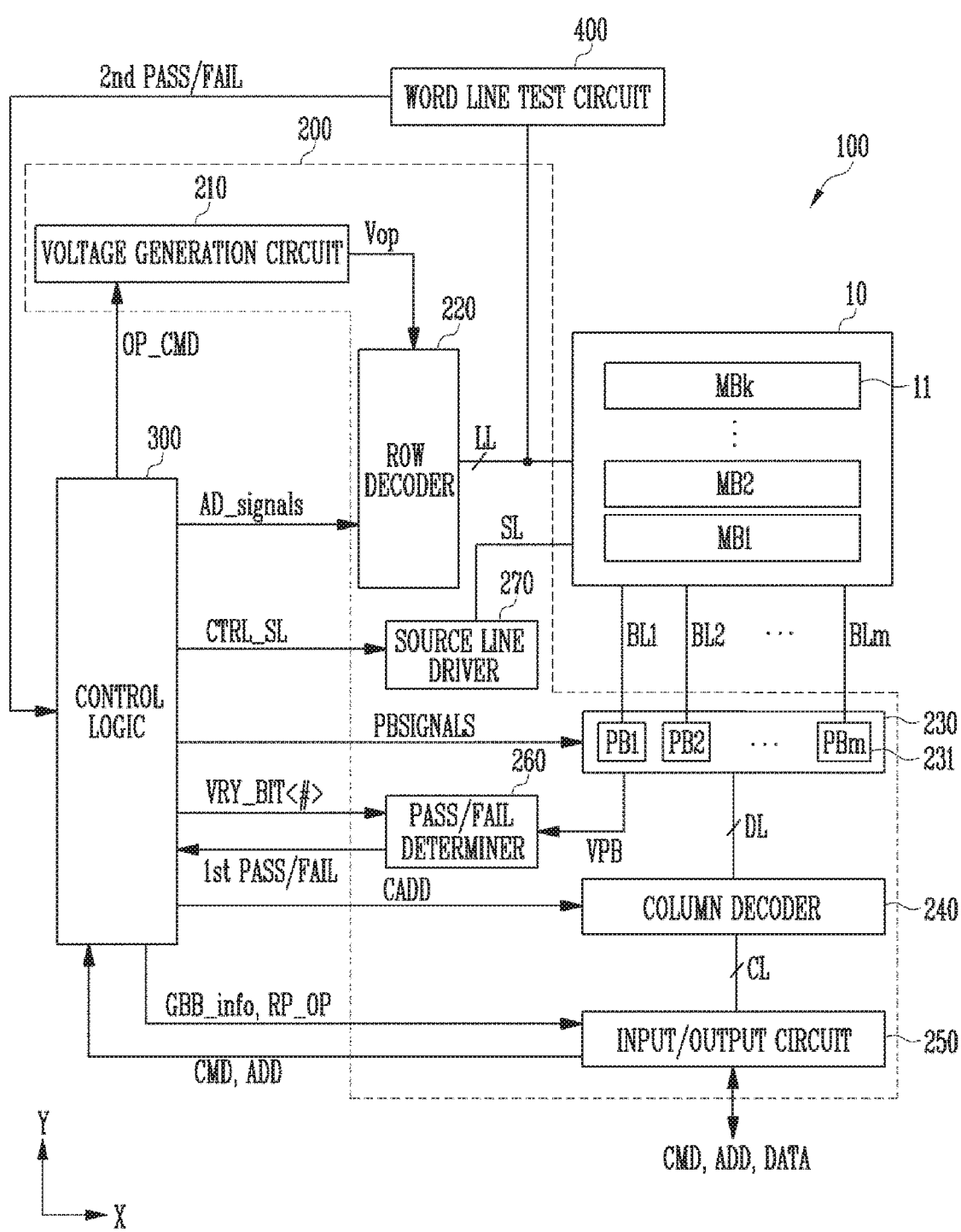
FIG. 2 is a block diagram for describing a configuration of a semiconductor memory device of FIG. 1.

FIG. 2 is a block diagram for describing a configuration of the semiconductor memory device of FIG. 1.

Referring to FIG. 2, the semiconductor memory device 100 may include a memory cell array 10 in which data is stored. The semiconductor memory device 100 may include a peripheral circuit 200 configured to perform a program operation for storing data in the memory cell array 10, a read operation for outputting the stored data, and an erase operation for erasing the stored data. The peripheral circuit 200 may measure a threshold voltage of a selected memory block among the memory blocks 11 included in the memory cell array 10, that is, select transistors included in the target block, during the GBB check operation, and may output the GBB check operation result as a first pass/fail signal 1st PASS/FAIL based on the measured threshold voltage. The semiconductor memory device 100 may include control logic 300 that controls the peripheral circuit 200 under control of the controller 1200 of FIG. 1. The semiconductor memory device 100 may include a word line test circuit 400. The word line test circuit 400 may perform a test operation on the local lines LL connected to the target block during the GBB check operation, and output a test operation result as a second pass/fail signal 2nd PASS/FAIL. The control logic 300 may be implemented as hardware, software, or a combination of hardware and software. For example, the control logic 300 may be a control logic circuit operating in accordance with an algorithm and/or a processor executing control logic code.

The memory cell array 10 may include a plurality of memory blocks MB1 to MBk; 11 (k is a positive integer). Local lines LL and bit lines BL1 to BLm (m is a positive integer) may be connected to each of the memory blocks MB1 to MBk; 11. For example, the local lines LL may include a first select line, a second select line, and a plurality of word lines arranged between the first and second select lines. In addition, the local lines LL may include dummy lines arranged between the first select line and the word lines, and between the second select line and the word lines. Here, the first select line may be a source select line, and the second select line may be a drain select line. For example, the local lines LL may include the word lines, the drain and source select lines, and source lines SL. For example, the local lines LL may further include the dummy lines. For example, the local lines LL may further include pipe lines. The local lines LL may be connected to the memory blocks MB1 to MBk; 11, respectively, and the bit lines BL1 to BLm may be commonly connected to the memory blocks MB1 to MBk; 11. The memory blocks MB1 to MBk; 11 may be implemented in a two-dimensional or three-dimensional structure. For example, the memory cells may be arranged in a direction parallel to a substrate in the memory block 11 of the two-dimensional structure. For example, the memory cells may be stacked in a direction perpendicular to the substrate in the memory block 11 of the three-dimensional structure.

The peripheral circuit 200 may be configured to perform the program, read, and erase operations of the selected memory block 11 under control of the control logic 300. For example, the peripheral circuit 200 may include a voltage generation circuit 210, a row decoder 220, a page buffer group 230, a column decoder 240, an input/output circuit 250, a pass/fail determiner (pass/fail check circuit) 260, and a source line driver 270.

The voltage generation circuit 210 may generate various operation voltages Vop used in the program, read, and erase operations in response to an operation signal OP_CMD. In addition, the voltage generation circuit 210 may selectively discharge the local lines LL in response to the operation signal OP_CMD. For example, the voltage generation circuit 210 may generate a program voltage, a verify voltage, a read voltage, a pass voltage, and a select transistor operation voltage under the control of the control logic 300.

The row decoder 220 may transfer the operation voltages Vop to the local lines LL connected to the selected memory block 11 in response to row decoder control signals AD_signals. For example, the row decoder 220 may selectively apply the operation voltages (for example, the program voltage, the verify voltage, the read voltage, the pass voltage, and the like) generated in the voltage generation circuit 210 in response to the control signals AD_signals to the word lines among the local lines LL.

For example, the row decoder 220 applies the program voltage generated in the voltage generation circuit 210 to the selected word line among the local lines LL and applies the pass voltage generated in the voltage generation circuit 210 to the remaining unselected word lines, in response to the row decoder control signals AD_signals during a program voltage application operation. In addition, the row decoder 220 applies the read voltage generated in the voltage generation circuit 210 to the selected word line among the local lines LL and applies the pass voltage generated in the voltage generation circuit 210 to the remaining unselected word lines, in response to the row decoder control signals AD_signals during the read operation.

The page buffer group 230 may include a plurality of page buffers PB1 to PBm; 231 connected to the bit lines BL1 to BLm. The page buffers PB1 to PBm; 231 may operate in response to page buffer control signals PBSIGNALS. For example, the page buffers PB1 to PBm; 231 may temporarily store data to be programmed during the program operation or sense a voltage or a current of the bit lines BL1 to BLm during the read operation or the verify operation. The page buffer group 230 may sense a threshold voltage of drain select transistors and source select transistors included in a selected memory block during the GBB check operation, and generate and output a sensing voltage VPB according to a sensing result. For example, during the GBB check operation, the page buffer group 230 may generate and output the sensing voltage VPB based on the number of select transistors of which a threshold voltage is lower than a first measurement voltage among the drain select transistors and the source select transistors, and may generate and output the sensing voltage VPB based on the number of select transistors of which a threshold voltage is higher than a second measurement voltage among the drain select transistors and the source select transistors.

The column decoder 240 may transfer data between the input/output circuit 250 and the page buffer group 230 in response to a column address CADD. For example, the column decoder 240 may exchange data with the page buffers 231 through data lines DL, or may exchange data with the input/output circuit 250 through column lines CL.

The input/output circuit 250 may transfer the command CMD and an address ADD received from the controller

1200 of FIG. 1 to the control logic 300. In addition, the input/output circuit 250 may exchange the data DATA with the column decoder 240.

The pass/fail determiner 260 may generate a reference current in response to a permission bit VRY_BIT<#> during an erase verify operation, compare a sensing voltage VPB received from the page buffer group 230 with a reference voltage generated by the reference current, and generate a first pass/fail signal 1st PASS/FAIL.

In addition, the pass/fail determiner 260 counts select transistors of which the threshold voltage is lower than the first measurement voltage based on the sensing voltage VPB received from the page buffer group 230 during a first test read operation of the GBB check operation to generate a first count, and counts select transistors of which the threshold voltage is higher than the second measurement voltage based on the sensing voltage VPB received from the page buffer group 230 during a second test read operation of the GBB check operation to generate a second count. The second measurement voltage is a voltage higher than the first measurement voltage. The first measurement voltage and the second measurement voltage are in a normal threshold voltage range of the select transistors. The pass/fail determiner 260 may generate the first pass/fail signal 1st PASS/FAIL by comparing a sum of the first count and the second count with a threshold count. For example, when the sum of the first count and the second count is equal to or greater than the threshold count, the pass/fail determiner 260 may generate a first fail signal 1st FAIL, and the first fail signal 1st FAIL may be a signal indicating that the target block is a GBB block. In addition, when the sum of the first count and the second count is less than the threshold count, the pass/fail determiner 260 generates a first pass signal 1st PASS, and the first pass signal 1st PASS may be a signal indicating that the block is not the GBB block.

The source line driver 270 may be connected to the memory cell included in the memory cell array 10 through the source line SL and may control a voltage applied to the source line SL. The source line driver 270 may receive a source line control signal CTRL_SL from the control logic 300 and may control a source line voltage (for example, an erase voltage) applied to the source line SL based on the source line control signal CTRL_SL.

The control logic 300 may output the operation signal OP_CMD, the row decoder control signal AD_signals, the page buffer control signals PBSIGNALS, the source line control signal CTRL_SL, and the permission bit VRY_BIT<#> in response to the command CMD and the address ADD to control the peripheral circuit 200 to perform the various operations, for example, the program operation, the read operation, the an erase operation, and the like. In addition, during the GBB check operation, the control logic 300 may determines whether the selected memory block, that is, the target block is the GBB based on the first pass/fail signal 1st PASS/FAIL or the second pass/fail signal 2nd PASS/FAIL. When the target block is determined as the GBB, a replacement block selection operation of selecting a replacement block for replacing the target block may be performed. In addition, the control logic 300 may control the peripheral circuit 200 to update GBB information in a content addressable memory (CAM) block when the program operation is performed by replacing the target block with the replacement block.

The word line test circuit 400 performs the test operation on the local lines LL connected to the target block during the GBB check operation. The test operation may be performed by applying a test voltage to the local lines LL connected to the target block, and comparing a measured voltage, which is obtained by measuring a voltage of the local lines LL, with a reference voltage. For example, during the GBB check operation, when the measured voltage of the local lines LL is lower than the reference voltage, the word line test circuit 400 determines the GBB check operation result as a fail and outputs a second fail signal 2nd FAIL. In addition, during the GBB check operation, when the measured voltage of the local lines LL is equal to or higher than the reference voltage, the word line test circuit 400 determines the GBB check operation result as a pass and outputs a second pass signal 2nd PASS.

In the above-described embodiment, the word line test circuit 400 applies the test voltage to the local lines LL connected to the target block, and then compares the measured voltage of the local lines LL with the reference voltage to perform the GBB check operation. However, the word line test circuit 400 may perform the GBB check operation by applying a test current to the local lines LL connected to the target block and comparing a measured current with a reference current of the local lines LL.

Figure 3:
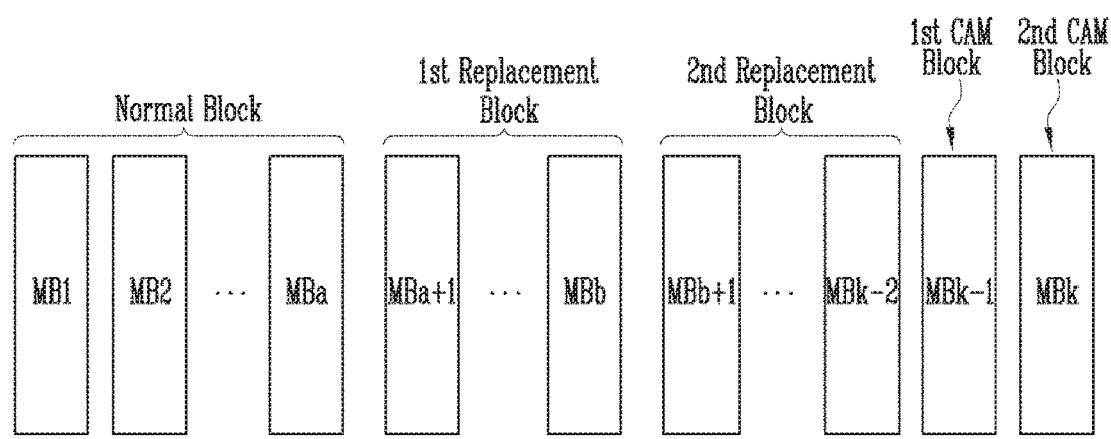
FIG. 3 is a block diagram for describing memory blocks included in a memory cell array of FIG. 2.

FIG. 3 is a block diagram for describing the memory blocks included in the memory cell array of FIG. 2.

Referring to FIG. 3, the plurality of memory blocks MB1 to MBk included in the memory cell array may include normal blocks Normal Block, a first replacement block 1st Replacement Block, a second replacement block 2nd Replacement Block, a first CAM block 1st CAM Block, and a second CAM block 2nd CAM Block. The plurality of memory blocks MB1 to MBk may be configured in a structure similar to each other.

The normal blocks Normal Block; MB1 to MBa are memory blocks selected to store data to be programmed, which is received from the outside (the controller 1200 of FIG. 1), read the stored data, or erase the stored data during various operations, for example, the program operation, the read operation, or the erase operation, of the semiconductor memory device 100. A memory block selected from the normal blocks Normal Block; MB1 to MBa may be defined as the target block.

The first replacement block 1st Replacement Block; MBa+1 to MBb may be memory blocks for replacing memory blocks determined as the initial bad block among the normal blocks Normal Block; MB1 to MBa. For example, an address mapping is corrected so that an address corresponding to the memory block (for example, MB1) determined as the initial bad block among the normal blocks Normal Block; MB1 to MBa corresponds to a memory block (for example, MBa+1) included in the first replacement block 1st Replacement Block; MBa+1 to MBb. During the various operations, when the address corresponding to the memory block (for example, MB1) determined as the initial bad block is received from the controller 1200, the memory block MBa+1 included in the first replacement block 1st Replacement Block; MBa+1 to MBb is selected instead of the memory block MB1 determined as the initial bad block and the various operations are performed.

The second replacement blocks 2nd Replacement Block; MBb+1 to MBk−2 may be memory blocks for replacing the memory blocks determined as the GBB as the GBB check operation result among the normal blocks Normal Block; MB1 to MBa. For example, an address mapping is corrected so that an address corresponding to the memory block (for example, MB2) determined as the GBB among the normal blocks Normal Block; MB1 to MBa corresponds to the memory block (for example, MBb+1) included in the second replacement blocks 2nd Replacement Block; MBb+1 to MBk-2. During the overall operation, when the address corresponding to the memory block (for example, MB2) determined as the GBB in received from the controller 1200, the memory block MBb+1 included in the second replacement blocks 2nd Replacement Block; MBb+1 to MBk-2 is selected instead of the memory block (for example, MB2) determined as the GBB and the overall operation is performed.

The first CAM block 1st CAM Block; MBk-1 may store system data and information on the initial bad block. For example, the first CAM block 1st CAM Block may store the system data required for an operation of the semiconductor memory device 100, such as option parameter information and information on the operation voltages of the semiconductor memory device 100, and the information on the initial bad block. The information on the initial bad block may include mapping address information of the initial bad block and the replacement block.

The second CAM block 2nd CAM Block; MBk may store information on the memory blocks determined as the GBB as the GBB check operatic result of the semiconductor memory device 100. For example, when the memory block determined as the GBB is detected as the GBB check operation result of the semiconductor memory device 100, the second CAM block 2nd CAM Block; MBk updates and stores the information on the memory blocks determined as the GBB. Accordingly, the second CAM block 2nd CAM Block; MBk may perform an update operation whenever the memory blocks determined as the GBB are detected during the overall operation of the semiconductor memory device 100.

In the present disclosure, when the memory block determined as the GBB is detected, the information on the memory block determined as the GBB is updated and stored in the second CAM block 2nd CAM Block; MBk different from the first CAM block 1st CAM Block; MBk-1 in which the system data is stored. Therefore, the first CAM block 1st CAM Block; MBk-1 in which the system data is stored may be prevented from being continuously programmed according to the update operation during the overall operation, and thus stability of the first CAM block 1st CAM Block; MBk-1 in which the system data is stored may be improved.

Figure 4:
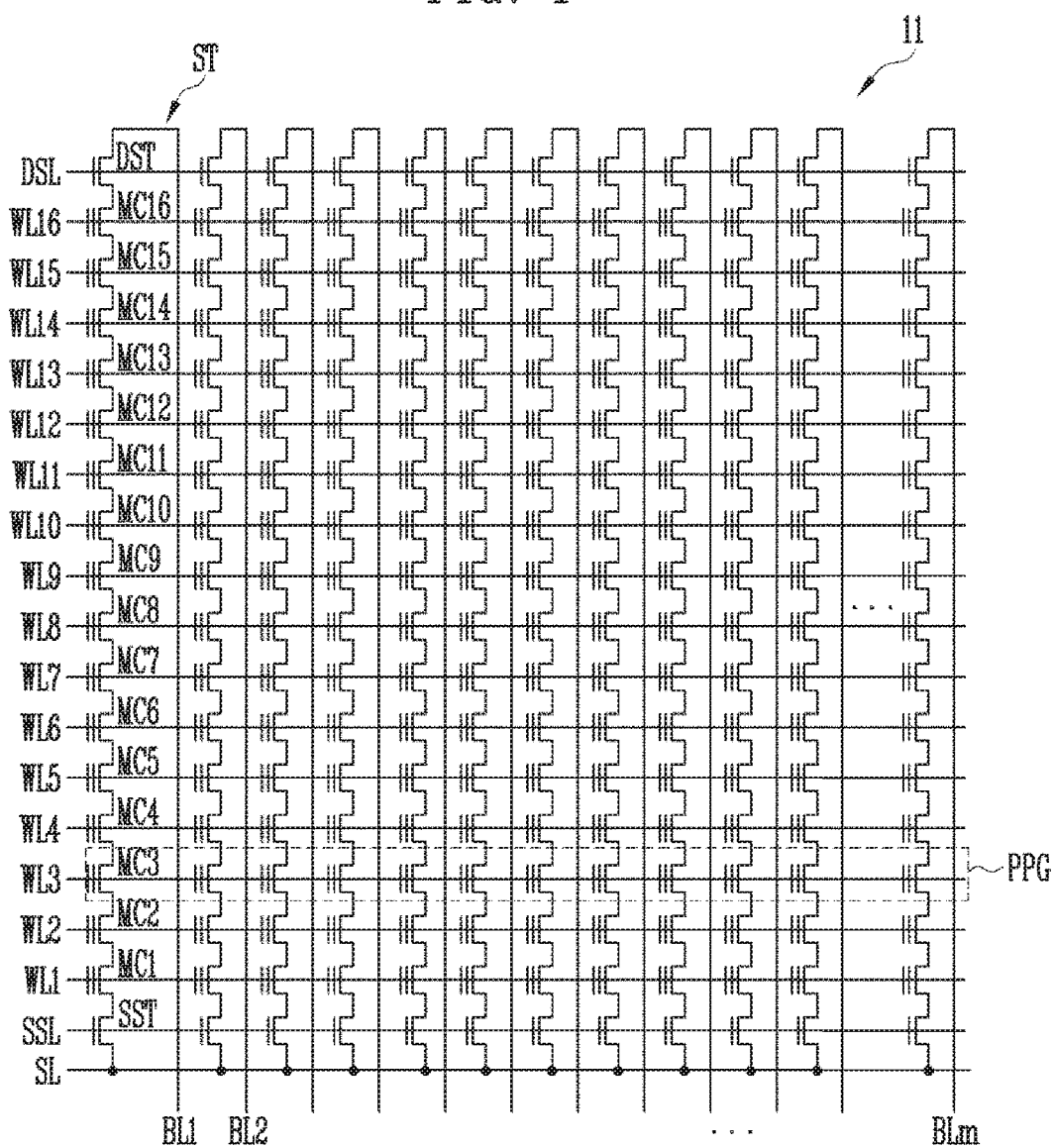
FIG. 4 is a diagram for describing a memory block of FIG. 2.

FIG. 4 is a diagram for describing the memory block of FIG. 2.

Referring to FIG. 4, the memory block 11 may be connected to a plurality of word lines WL1 to WL16 arranged in parallel with each other between the first select line and the second select line. Here, the first select line may be the source select line SSL, and the second select line may be the drain select line DSL. For example, the memory block 11 may include a plurality of strings ST connected between the bit lines BL1 BLm and the source line SL. The bit lines BL1 to BLm may be connected to the strings ST, respectively, and the source line SL may be commonly connected to the strings ST. Since the strings ST may be configured to be identical to each other, a string ST connected to the first bit line BL1 will be specifically described, as an example.

The string ST may include a source select transistor SST, a plurality of memory cells MC1 to MC16, and a drain select transistor DST connected in series between the source line SL and the first bit line BL1. One string ST may include at least one or more of the source select transistor SST and the drain select transistor DST, and may include the memory cells MC1 to MC16 more than the number shown in the figure.

A source of the source select transistor SST may be connected to the source line SL and a drain of the drain select transistor DST may be connected to the first bit line BL1. The memory cells MC1 to MC16 may be connected in series between the source select transistor SST and the drain select transistor DST. Gates of the source select transistors SST included in the different strings ST may be connected to the source select line SSL, gates of the drain select transistors DST may be connected to the drain select line DSL, and gates of the memory cells MC1 to MC16 may be connected to the plurality of word lines WL1 to WL16. A group of the memory cells connected to the same word line among the memory cells included in different strings ST may be referred to as a physical page PPG. Therefore, the memory block 11 may include the physical pages PPG of the number of the word lines WL1 to WL16.

One memory cell may store one bit of data. This is commonly referred to as a single level cell (SLC). In this case, one physical page PPG may store one logical page (LPG) data. One logical page (LPG) data may include data bits of the number of cells included in one physical page PPG. In addition, one memory cell may store two or more bits of data. This is commonly referred to as a multi-level cell (MLC). In this case, one physical page PPG may store two or more logical page (LPG) data.

Figure 5:
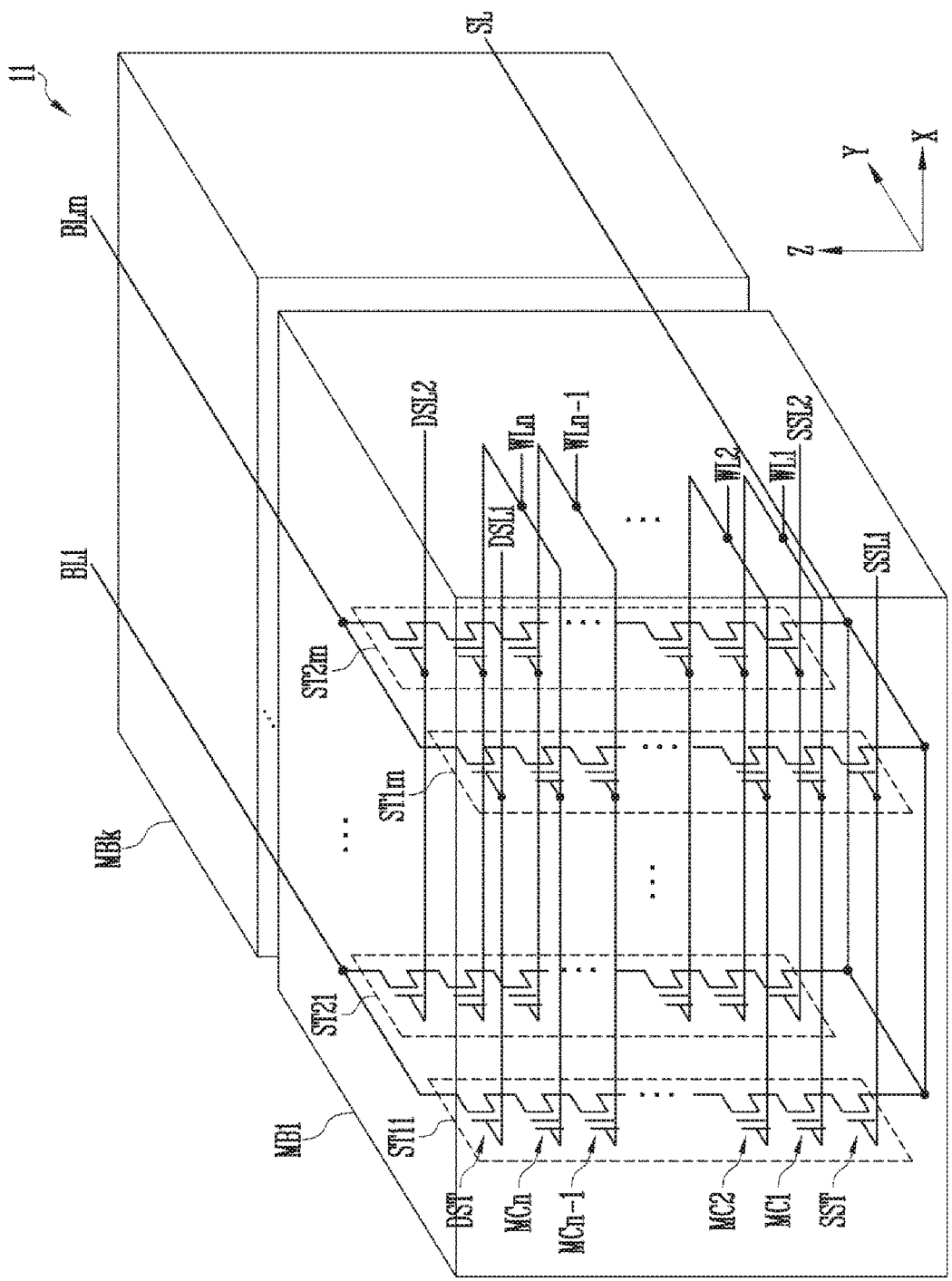
FIG. 5 is a diagram for describing an embodiment of a memory block configured in a three-dimension.

FIG. 5 is a diagram for describing an embodiment of a memory block configured in a three-dimension.

Referring to FIG. 5, the memory cell array 10 may include a plurality of memory blocks MB1 to MBk; 11. Each of the memory block 11 may include a plurality of strings ST11 to ST1m and ST21 to ST2m. Each of the plurality of strings ST11 to ST1m and ST21 to ST2m may be extended in a vertical direction (Z direction). In the memory block 11, m strings may be arranged in a row direction (X direction). In FIG. 5, two strings are arranged in a column direction (Y direction), but this is for convenience of description, and three or more strings may be arranged in the column direction (Y direction).

Each of the plurality of strings ST11 to ST1m and ST21 to ST2m may include at least one source select transistor SST, first to n-th memory cells MC1 to MCn, and at least one drain select transistor DST.

The source select transistor SST of each string may be connected between the source line SL and the memory cells MC1 to MCn. The source select transistors of the strings arranged in the same row may be connected to the same source select line. The source select transistors of the strings ST11 to ST1m arranged in the first row may be connected to a first source select line SSL1. The source select transistors of the strings ST21 to ST2m arranged in the second row may be connected to a second source select line SSL2. As another embodiment, the source select transistors of the strings ST11 to ST1m and ST21 to ST2m may be commonly connected to one source select line.

The first to n-th memory cells MC1 to MCn of each string may be connected to each other in series between the source select transistor SST and the drain select transistor DST. Gates of the first to n-th memory cells MC1 to MCn may be connected to the first to n-th word lines WL1 to WLn, respectively.

As an embodiment, at least one of the first to n-th memory cells MC1 to MCn may be used as a dummy memory cell. When the dummy memory cell is provided, a voltage or a current of a corresponding string may be stably controlled. Therefore, reliability of the data stored in the memory block 11 may be improved.

The drain select transistor DST of each string may be connected between the bit line and the memory cells MC1 to MCn. The drain select transistors DST of the strings arranged in the row direction may be connected to the drain select line extending in the row direction. The drain select transistors DST of the strings ST11 to ST1m of the first row may be connected to a first drain select line Dal. The drain select transistors DST of the strings ST21 to ST2m of the second row may be connected to a second drain select line DSL2.

In the memory blocks MB1 to MBk, one memory block may share the word lines WL1 to WLn with another memory block, and the memory blocks sharing the word lines WL1 to WLn may be defined as a shared memory block.

Figure 6:
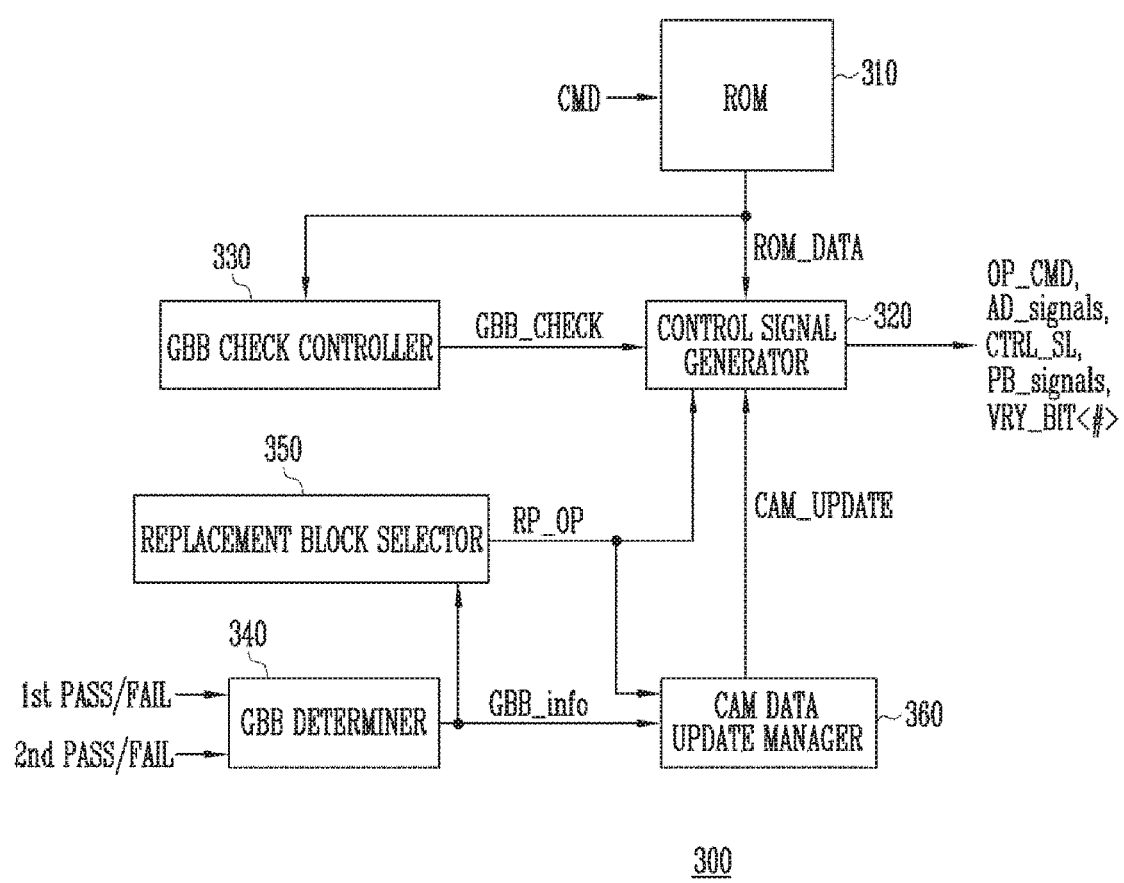
FIG. 6 is a block diagram for describing a control logic of FIG. 2.

FIG. 6 is a block diagram for describing the control logic of FIG. 2.

Referring to FIG. 6, the control logic 300 may include a read-only memory (ROM) 310, a control signal generator 320, a GBB check controller 330, a GBB determiner 340, a replacement block selector 350, and CAM data update manager 360.

In the ROM 310, ROM data ROM_DATA corresponding to an algorithm for performing various operations (the program operation, the read operation, the erase operation, and the like) of the semiconductor memory device may be stored. The ROM 310 may output the ROM data ROM_DATA in response to the received command CMD. For example, when the received command CMD corresponds to the program operation, the ROM 310 outputs ROM data ROM_DATA corresponding to the program operation. In addition, when the received command CMD corresponds to the erase operation, the ROM 310 outputs ROM data ROM_DATA for the erase operation.

The control signal generator 320 generates and outputs the operation signal OP_CMD, the row decoder control signal AD_signals, the page buffer control signals PBSIGNALS, the source line control signal CTRL_SL, and the permission bit VRY_BIT<#> for controlling the peripheral circuit 200 of FIG. 2 during the overall operation in response to the ROM data ROM_DATA. For example, the control signal generator 320 generates and outputs the operation signal OP_CMD, the row decoder control signal AD_signals, the page buffer control signals PBSIGNALS, the source line control signal CTRL_SL, and the permission bit VRY_BIT<#> for controlling the peripheral circuit 200 of FIG. 2 to perform the program operation in response to the ROM data ROM_DATA corresponding to the program operation.

The GBB check controller 330 generates and outputs a GBB check signal GBB_CHECK instructing to perform the GBB check operation before performing the program operation in response to the ROM data ROM_DATA corresponding to the program operation. The control signal generator 320 may generate and output the operation signal OP_CMD, the row decoder control signal AD_signals, the page buffer control signals PBSIGNALS, the source line control signal CTRL_SL, and the permission bit VRY_BIT<#> for controlling the peripheral circuit 200 of FIG. 2 to perform the GBB check operation in response to the GBB check signal GBB_CHECK. The GBB check controller 330 may generate and output GBB check signal GBB_CHECK to perform the GBB check operation immediately before performing the program operation in response to the ROM data ROM_DATA corresponding to the program operation, immediately after the erase operation performed before the program operation, or immediately before the erase operation performed before the program operation.

The GBB determiner 340 receives the first pass/fail signal 1st PASS/FAIL from the pass/fail determiner 260 of FIG. 2 during the GBB check operation, or receives the second pass/fail signal 2nd PASS/FAIL from the word line test circuit 400 of FIG. 2. The GBB determiner 340 determines whether the target memory block of the GBB check operation, that is, the target block is the GBB in response to the received first pass/fail signal 1st PASS/FAIL or second pass/fail signal 2nd PASS/FAIL. For example, the GBB determiner 340 may determine whether the target block is the GBB based on the first pass/fail signal 1st PASS/FAIL, determine whether the target block is the GBB based on the second pass/fail signal 2nd PASS/FAIL, or determine whether the target block is the GBB based on the first pass/fail signal 1st PASS/FAIL and the second pass/fail signal 2nd PASS/FAIL. The GBB determiner 340 may output information on the target block as GBB information GBB_info when the target block is determined as the GBB.

The replacement block selector 350 receives the GBB information GBB_info from the GBB determiner 340, and selects a memory block in which valid data is not stored among the second replacement blocks 2nd Replacement Block; MBb+1 to MBk−2 of FIG. 3 as the replacement block in order to replace the target block. The selected replacement block may be a memory block of an erased state or a state in which invalid data is stored. The replacement block selector 350 may generate and output replacement block operation information RP_OP including information on the selected replacement block. The control signal generator 320 may generate and output the operation signal OP_CMD, the row decoder control signal AD_signals, the page buffer control signals PBSIGNALS, the source line control signal CTRL_SL, and the permission bit VRY_BIT<#> for controlling the peripheral circuit 200 of FIG. 2 to perform the program operation on the replacement block instead of the target block in response to the replacement block operation information RP_OP.

The CAM data update manager 360 generates and outputs a CAM data update signal CAM_UPDATE for updating the information on the memory blocks determined as the GBB stored in the second CAM block 2nd CAM Block; MBk of FIG. 3 in response to the GBB information GBB_info and the replacement block operation information RP_OR In addition, the CAM data update manager 360 transmits the GBB information GBB_info and the replacement block operation information RP_OP to the input/output circuit 250 of FIG. 2 to be stored in the page buffer group 230. The control signal generator 320 may generate and output the operation signal OP_CMD, the row decoder control signal AD_signals, the page buffer control signals PBSIGNALS, the source line control signal CTRL_SL, and the permission bit VRY_BIT<#> for controlling the peripheral circuit 200 to store the GBB information GBB_info and the replacement block operation information RP_OP in the second CAM block 2nd CAM Block; MBk, in response to the CAM data update signal CAM_UPDATE. The GBB information GBB_info may include information on the target block, and the replacement block operation information RP_OP may include information on the replacement block replacing the target block.

Figure 7:
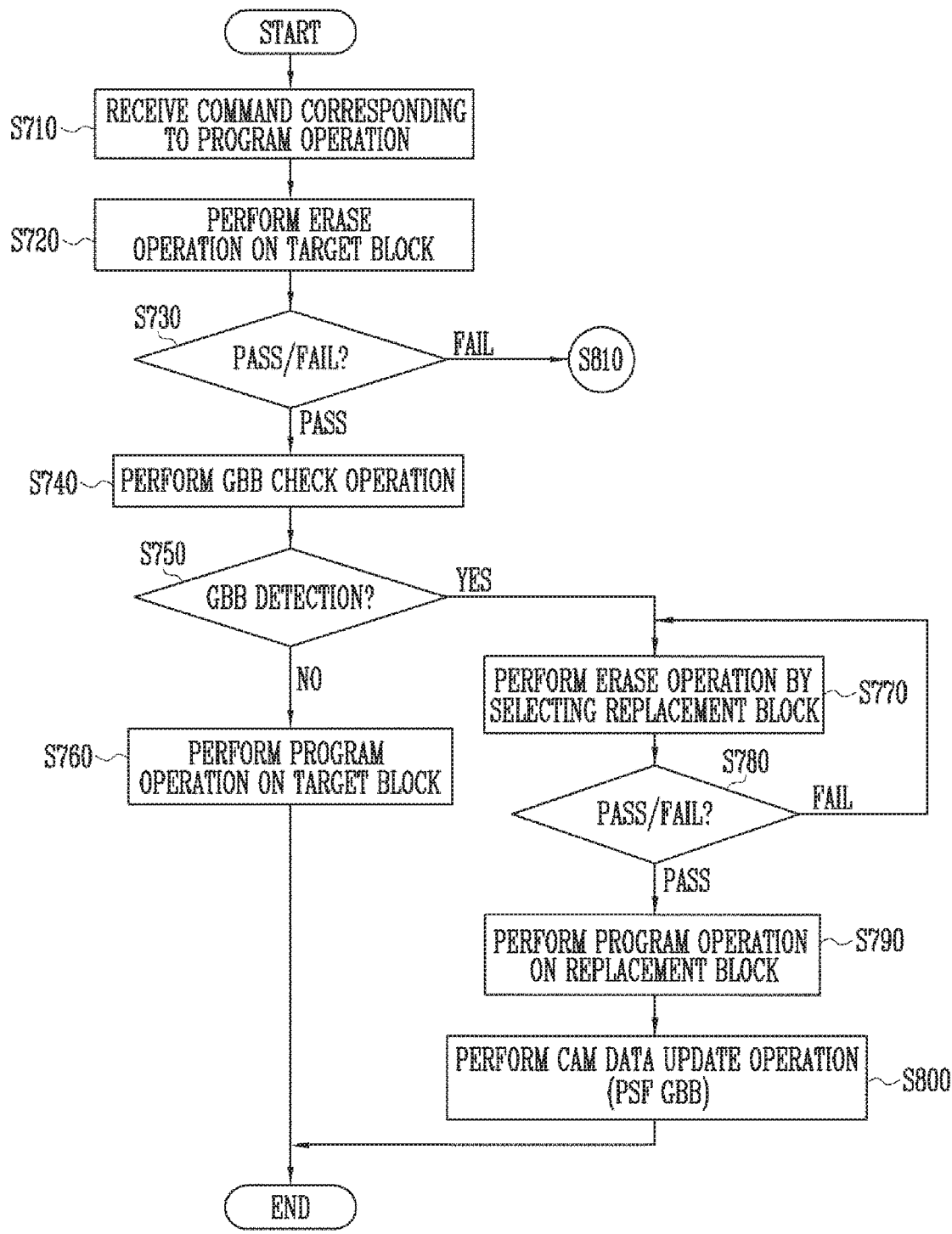
FIGS. 7 and 8 are flowcharts for describing an operation of the semiconductor memory device according to an embodiment of the present disclosure.
Figure 8:
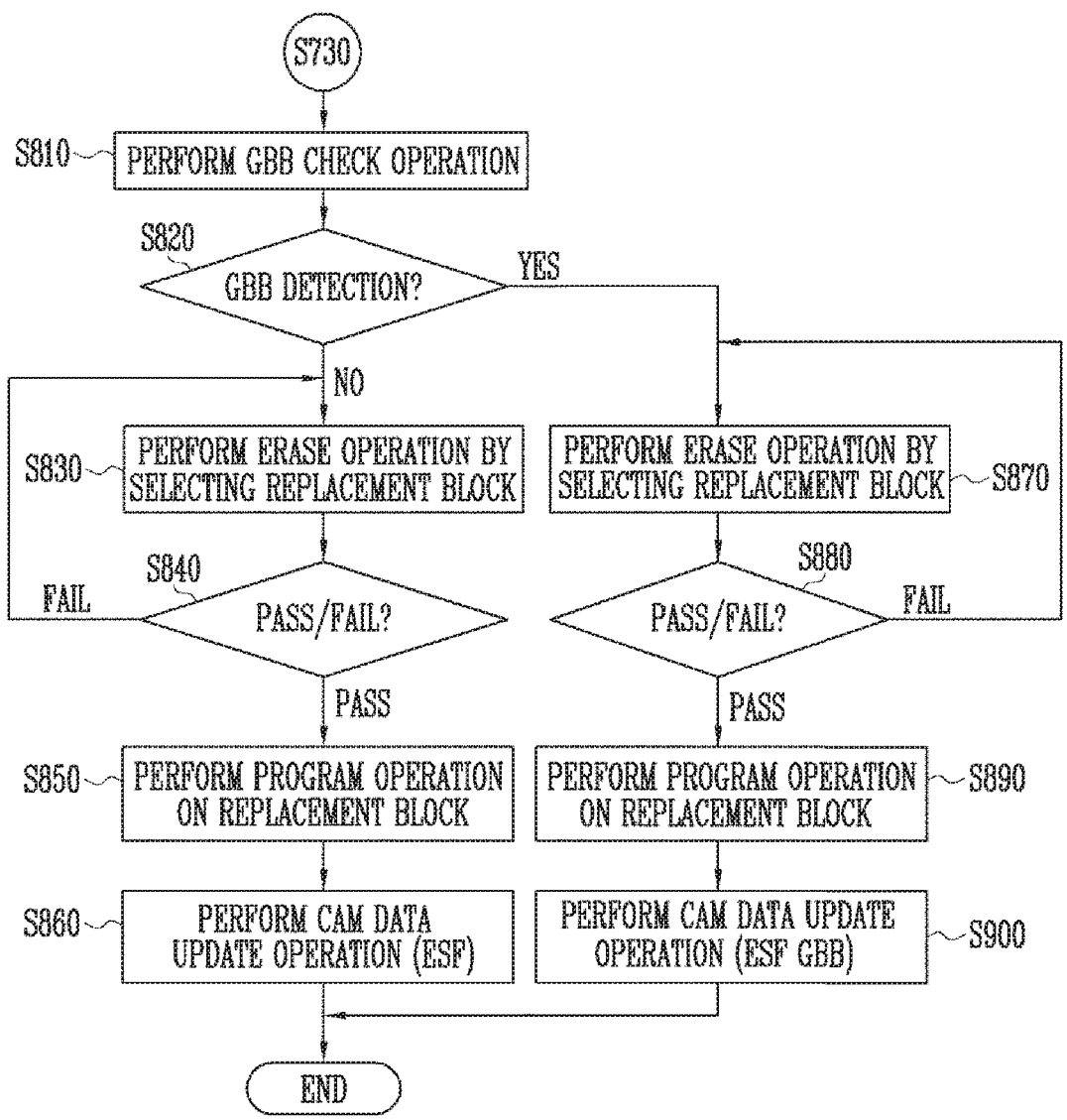

FIGS. 7 and 8 are flowcharts for describing an operation of the semiconductor memory device according to an embodiment of the present disclosure.

A method of operating the semiconductor memory device according to an embodiment of the present disclosure will be described with reference to FIGS. 2 to 8 as follows.

In step S710, the semiconductor memory device 100 receives the command CMD corresponding to the program operation from the outside (for example, the controller 1200 of FIG. 1). The semiconductor memory device 100 may receive the address ADD and data DATA, which is to be programmed, together with the command CMD. The control logic 300 selects the target block on which the program operation is to be performed in response to the command CMD and the address ADD corresponding to the program operation. The target block is any one (for example, MB1) of the normal blocks Normal Block; MB1 to MBa.

In step S720, the peripheral circuit 200 perform the erase operation for erasing invalid data stored in the target block MB1 according to the control of the control logic 300. For example, the source line driver 270 receives the source line control signal CTRL_SL from the control logic 300, and applies the erase voltage to the source line SL of the target block MB1 based on the source line control signal CTRL_SL. The page buffer group 230 controls the bit lines BL1 to BLm to be in a floating state, or applies the erase voltage. The word lines of the target block MB1 may be controlled to a ground voltage level by the row decoder 220. Therefore, data stored in the memory cells included in the target block MB1 are erased.

Step S720 described above may be skipped when the target block MB1 is a free block of an erased state in which data is not stored.

In step S730, a status check operation is performed on the target block MB1 on which the erase operation is performed. The status check operation is determined as a pass when the number of memory cells having a threshold voltage higher than a target erase level among the memory cells included in the target block MB1 is equal to or less than a setting number, and is determined as a fail when the number of memory cells having the threshold voltage higher than the target erase level is greater than the setting number. The status check operation may be a verify operation for determining whether the erase operation is normally performed.

When it is determined as the pass (pass) as a status check operation result in step S730 described above, the GBB check operation is performed in step S740.

For example, the ROM of the control logic 300 outputs the ROM data ROM_DATA in response to the command CMD corresponding to the program operation. The GBB check controller 330 generates and outputs the GBB check signal GBB_CHECK after performing the erase operation of step S720 described above in response to the ROM data ROM-DATA. The control signal generator 320 generates and outputs the operation signal OP_CMD, the row decoder control signal AD_signals, the page buffer control signals PBSIGNALS, the source line control signal CTRL_SL, and the permission bit VRY_BIT<#> for controlling the peripheral circuit 200 to perform the GBB check operation in response to the GBB check signal GBB_CHECK. The GBB check controller 330 may generate and output the GBB check signal GBB_CHECK to perform the GBB check operation immediately before performing the program operation, immediately after the erase operation performed before the program operation, or immediately before the erase operation performed before the program operation in response to the ROM data ROM_DATA corresponding to the program operation.

An operation method of the GBB check operation will be described later with reference to FIGS. 9 to 12.

In step S750, it is determined whether the target block MB1 is detected as the GBB as the GBB check operation result. For example, the GBB determiner 340 of the control logic 300 may determine whether the target block is the GBB based on the first pass/fail signal 1st PASS/FAIL, the second pass/fail signal 2nd PASS/FAIL, or the first pass/fail signal 1st PASS/FAIL and the second pass/fail signal 2nd PASS/FAIL, and may output the information on the target block as the GBB information GBB_info when the target block is determined as the GBB.

When it is determined in step S750 that the target block is not detected as the GBB as the GBB check operation result (No), the program operation is performed on the target block in step S760.

For example, the plurality of page buffers PB1 to PBm; 231 of the page buffer group 230 receive and temporarily store the data DATA to be programmed, and adjust a potential level of the bit lines BL1 to BLm according to the temporarily stored data. The voltage generation circuit 210 generates and outputs the operation voltage Vop including the program voltage and the pass voltage. The row decoder 220 applies the program voltage to the selected word line of the target block MB1 and applies the pass voltage to the remaining non-selected word lines to perform the program operation.

When it is determined in step S750 that the target block is detected as the GBB (Yes) as the GBB check operation result, the erase operation is performed by selecting the replacement block in step S770.

For example, the replacement block selector 350 selects any one (for example, MBb+1) of the second replacement block 2nd Replacement Block; MBb+1 to MBk−2) as the replacement block to replace the target block in response to the GBB information GBB_info. The replacement block selector 350 may generate and output the replacement block operation information RP_OP including information on the selected replacement block.

The control signal generator 320 generates and outputs the page buffer control signals PBSIGNALS and the source line control signal CTRL_SL for controlling the peripheral circuit 200 to perform the erase operation of the replacement block MBb+1 in response to the replacement block operation information RP_OP. For example, the source line driver 270 receives the source line control signal CTRL_SL from the control logic 300, and applies the erase voltage to the source line SL of the replacement block MBb+1 based on the source line control signal CTRL_SL. The page buffer group 230 controls the bit lines BL1 to BLm to be in a floating state, or applies the erase voltage. The word lines of the replacement block MBb+1 may be controlled to a ground voltage level by the row decoder 220. Therefore, data stored in the memory cells included in the replacement block MBb+1 are erased.

In step S780, a status check operation is performed on the replacement block MBb+1 on which the erase operation is performed. The status check operation is determined as a pass when the number of memory cells having a threshold voltage higher than a target erase level among the memory cells included in the replacement block MBb+1 is equal to or less than a setting number, and is determined as a fail when the number of memory cells having the threshold voltage higher than the target erase level is greater than the setting number. The status check operation may be a verify operation for determining whether the erase operation is normally performed.

When it is determined as the fail (fail) as a status check operation result in step S780 described above, any one (for example, MBk−2) except for the previously selected replacement block MBb+1 among the second replacement blocks 2nd Replacement Block; MBb+1 to MBk−2 is newly selected as the replacement block replacing the target block, and the operation is performed again from step S770 described above.

When it is determined as the pass (pass) as the status check operation result in step S780 described above, the program operation on the replacement block (for example, MBb+1) is performed in step S790.

For example, the control signal generator 320 generates and outputs the operation signal OP_CMD, the row decoder control signal AD_signals, the page buffer control signals PBSIGNALS, the source line control signal CTRL_SL, and the permission bit VRY_BIT<#> for controlling the peripheral circuit 200 to perform the program operation on the replacement block (for example, MBb+1).

The plurality of page buffers PB1 to PBm; 231 of the page buffer group 230 receive and temporarily store the data DATA to be programmed, and adjust the potential level of the bit lines BL1 to BLm according to the temporarily stored data. The voltage generation circuit 210 generates and outputs the operation voltage Vop including the program voltage and the pass voltage. The row decoder 220 applies the program voltage to the selected word line of the replacement block MBb+1 and applies the pass voltage to the remaining non-selected word lines to perform the program operation.

When the program operation on the replacement block MBb+1 is completed, the CAM data update operation for updating the information on the target block MB1 determined as the GBB in the second CAM block 2nd CAM Block; MBk is performed in step S800.

For example, the CAM data update manager 360 generates and outputs the CAM data update signal CAM_UPDATE in response to the GBB information GBB_info and the replacement block operation information RP_OR The control signal generator 320 generates and outputs the operation signal OP_CMD, the row decoder control signal AD_signals, the page buffer control signals PBSIGNALS, the source line control signal CTRL_SL, and the permission bit VRY_BIT<#> for controlling the peripheral circuit 200 to perform the CAM data update operation (or CAM data program operation) on the second CAM block 2nd CAM Block; MBk.

The plurality of page buffers PB1 to PBm; 231 of the page buffer group 230 temporarily store the GBB information GBB_info and the replacement block operation information RP_OP received from the CAM data update manager 360 as CAM data, and adjust the potential level of the bit lines BL1 to BLm according to the temporarily stored CAM data. The voltage generation circuit 210 generates and outputs the operation voltage Vop including the program voltage and the pass voltage. The row decoder 220 applies the program voltage to the selected word line of the second CAM block 2nd CAM Block; MBk and applies the pass voltage to the remaining non-selected word lines to perform the CAM data update operation. The GBB information GBB_info may include information on the target block, and the replacement block operation information RP_OP may include information on the replacement block replacing the target block.

The target block MB1 is the memory block that is determined as the pass as the status check operation result of step S730 described above and determined as the GBB as the GBB check operation result of step S750 described above. Therefore, it may be determined as a program status fail (PSF) GBB determined as the bad block during the program operation, and the CAM data update operation may be performed by including information thereon in the GBB information GBB_info.

When it is determined as fail (fail) as the status check operation result in step S730 described above, the GBB check operation is performed in step S810.

For example, the ROM of the control logic 300 outputs the ROM data ROM_DATA in response to the command CMD corresponding to the program operation. The GBB check controller 330 generates and outputs the GBB check signal GBB_CHECK after performing the erase operation of step S720 described above in response to the ROM data ROM_DATA. The control signal generator 320 generates and outputs the operation signal OP_CMD, the row decoder control signal AD_signals, the page buffer control signals PBSIGNALS, the source line control signal CTRL_SL, and the permission bit VRY_BIT<#> for controlling the peripheral circuit 200 to perform the GBB check operation in response to the GBB check signal GBB_CHECK.

In step S820, it is determined whether the target block MB1 is detected as the GBB as the GBB check operation result. For example, the GBB determiner 340 of the control logic 300 may determine whether the target block is the GBB based on the first pass/fail signal 1st PASS/FAIL, the second pass/fail signal 2nd PASS/FAIL, or the first pass/fail signal 1st PASS/FAIL and the second pass/fail signal 2nd PASS/FAIL, and may output the information on the target block as the GBB information GBB_info when the target block is determined as the GBB.

When it is determined in step S820 that the target block is not detected as the GBB as the GBB check operation result (No), the erase operation is performed by selecting the replacement block in step S830.

For example, the replacement block selector 350 selects any one (for example, MBb+1) of the second replacement block 2nd Replacement Block; MBb+1 to MBk−2) as the replacement block to replace the target block in response to the GBB information GBB_info. The replacement block selector 350 may generate and output the replacement block operation information RP_OP including the information on the selected replacement block.

The control signal generator 320 generates and outputs the page buffer control signals PBSIGNALS and the source line control signal CTRL_SL for controlling the peripheral circuit 200 to perform the erase operation of the replacement block MBb+1 in response to the replacement block operation information RP_OP. For example, the source line driver 270 receives the source line control signal CTRL_SL from the control logic 300, and applies the erase voltage to the source line SL of the replacement block MBb+1 based on the source line control signal CTRL_SL. The page buffer group 230 controls the bit lines BL1 to BLm to be in a floating state, or applies the erase voltage. The word lines of the replacement block MBb+1 may be controlled to a ground voltage level by the row decoder 220. Therefore, data stored in the memory cells included in the replacement block MBb+1 are erased.

In step S840, a status check operation is performed on the replacement block MBb+1 on which the erase operation is performed. The status check operation is determined as a pass when the number of memory cells having a threshold voltage higher than a target erase level among the memory cells included in the replacement block MBb+1 is equal to or less than a setting number, and is determined as a fail when the number of memory cells having the threshold voltage higher than the target erase level is greater than the setting number. The status check operation may be a verify operation for determining whether the erase operation is normally performed.

When it is determined as the fail (fail) as a status check operation result in step S840 described above, any one (for example, MBk−2) except for the previously selected replacement block MBb+1 among the second replacement blocks 2nd Replacement Block; MBb+1 to MBk−2 is newly selected as the replacement block replacing the target block, and the operation is performed again from step S830 described above.

When it is determined as the pass (pass) as the status check operation result in step S840 described above, the program operation on the replacement block (for example, MBb+1) is performed in step S850.

For example, the control signal generator 320 generates and outputs the operation signal OP_CMD, the row decoder control signal AD_signals, the page buffer control signals PBSIGNALS, the source line control signal CTRL_SL, and the permission bit VRY_BIT<#> for controlling the peripheral circuit 200 to perform the program operation on the replacement block (for example, MBb+1).

The plurality of page buffers PB1 to PBm; 231 of the page buffer group 230 receive and temporarily store the data DATA to be programmed, and adjust the potential level of the bit lines BL1 to BLm according to the temporarily stored data. The voltage generation circuit 210 generates and outputs the operation voltage Vop including the program voltage and the pass voltage. The row decoder 220 applies the program voltage to the selected word line of the replacement block MBb+1 and applies the pass voltage to the remaining non-selected word lines to perform the program operation.

When the program operation on the replacement block MBb+1 is completed, the CAM data update operation for updating the information on the target block MB1 determined as the GBB in the second CAM block 2nd CAM Block; MBk is performed in step S860.

For example, the CAM data update manager 360 generates and outputs the CAM data update signal CAM_UPDATE in response to the GBB information GBB_info and the replacement block operation information RP_OR The control signal generator 320 generates and outputs the operation signal OP_CMD, the row decoder control signal AD_signals, the page buffer control signals PBSIGNALS, the source line control signal CTRL_SL and the permission bit VRY_BIT<#> for controlling the peripheral circuit 200 to perform the CAM data update operation (or CAM data program operation) on the second CAM block 2nd CAM Block; MBk.

The plurality of page buffers PB1 to PBm; 231 of the page buffer group 230 temporarily store the GBB information GBB_info and the replacement block operation information RP_OP received from the CAM data update manager 360 as CAM data, and adjust the potential level of the bit lines BL1 to BLm according to the temporarily stored CAM data. The voltage generation circuit 210 generates and outputs the operation voltage Vop including the program voltage and the pass voltage. The row decoder 220 applies the program voltage to the selected word line of the second CAM block 2nd CAM Block; MBk and applies the pass voltage to the remaining non-selected word lines to perform the CAM data update operation. It is preferable that the GBB information GBB_info includes the information on the target block and the replacement block operation information RP_OP includes the information on the replacement block replacing the target block.

The target block MB1 is the memory block that is determined as the fail as the status check operation result of step S730 described above and determined as a memory block that is not the GBB as the GBB check operation result of step S820 described above. Therefore, it may be determined as a block in which an erase status fail (ESF) occurs, and the CAM data update operation may be performed by including information thereon in the GBB information GBB_info.

When it is determined in step S820 that the target block is detected as the GBB (Yes) as the GBB check operation result in step S750, the erase operation is performed by selecting the replacement block in step S870.

For example, the replacement block selector 350 selects any one (for example, MBb+1) of the second replacement block 2nd Replacement Block; MBb+1 to MBk−2) as the replacement block to replace the target block in response to the GBB information GBB_info. The replacement block selector 350 may generate and output the replacement block operation information RP_OP including information on the selected replacement block.

The control signal generator 320 generates and outputs the page buffer control signals PBSIGNALS and the source line control signal CTRL_SL for controlling the peripheral circuit 200 to perform the erase operation of the replacement block MBb+1 in response to the replacement block operation information RP_OP. For example, the source line driver 270 receives the source line control signal CTRL_SL from the control logic 300, and applies the erase voltage to the source line SL of the replacement block MBb+1 based on the source line control signal CTRL_SL. The page buffer group 230 controls the bit lines BL1 to BLm to be in a floating state, or applies the erase voltage. The word lines of the replacement block MBb+1 may be controlled to a ground voltage level by the row decoder 220. Therefore, data stored in the memory cells included in the replacement block MBb+1 are erased.

In step S880, a status check operation is performed on the replacement block MBb+1 on which the erase operation is performed. The status check operation is determined as a pass when the number of memory cells having a threshold voltage higher than a target erase level among the memory cells included in the replacement block MBb+1 is equal to or less than a setting number, and is determined as a fail when the number of memory cells having the threshold voltage higher than the target erase level is greater than the setting number. The status check operation may be a verify operation for determining whether the erase operation is normally performed.

When it is determined as the fail (fail) as a status check operation result in step S880 described above, any one (for example, MBk−2) except for the previously selected replacement block MBb+1 among the second replacement blocks 2nd Replacement Block; MBb+1 to MBk−2 is newly selected as the replacement block replacing the target block, and the operation is performed again from step S870 described above.

When it is determined as the pass (pass) as the status check operation result in step S880 described above, the program operation on the replacement block (for example, MBb+1) is performed in step S890.

For example, the control signal generator 320 generates and outputs the operation signal OP_CMD, the row decoder control signal AD_signals, the page buffer control signals PBSIGNALS, the source line control signal CTRL_SL and the permission bit VRY_BIT<#> for controlling the peripheral circuit 200 to perform the program operation on the replacement block (for example, MBb+1).

The plurality of page buffers PB1 to PBm; 231 of the page buffer group 230 receive and temporarily store the data DATA to be programmed, and adjust the potential level of the bit lines BL1 to BLm according to the temporarily stored data. The voltage generation circuit 210 generates and outputs the operation voltage Vop including the program voltage and the pass voltage. The row decoder 220 applies the program voltage to the selected word line of the replacement block MBb+1 and applies the pass voltage to the remaining non-selected word lines to perform the program operation.

When the program operation on the replacement block MBb+1 is completed, the CAM data update operation for updating the information on the target block MB1 determined as the GBB in the second CAM block 2nd CAM Block; MBk is performed in step S900.

For example, the CAM data update manager 360 generates and outputs the CAM data update signal CAM_UPDATE in response to the GBB information GBB_info and the replacement block operation information RP_OP. The control signal generator 320 generates and outputs the operation signal OP_CMD, the row decoder control signal AD_signals, the page buffer control signals PBSIGNALS, the source line control signal CTRL_SL and the permission bit VRY_BIT<#> for controlling the peripheral circuit 200 to perform the CAM data update operation (or CAM data program operation) on the second CAM block 2nd CAM Block; MBk.

The plurality of page buffers PB1 to PBm; 231 of the page buffer group 230 temporarily store the GBB information GBB_info and the replacement block operation information RP_OP received from the CAM data update manager 360 as the CAM data, and adjust the potential level of the bit lines BL1 to BLm according to the temporarily stored CAM data. The voltage generation circuit 210 generates and outputs the operation voltage flop including the program voltage and the pass voltage. The row decoder 220 applies the program voltage to the selected word line of the second CAM block 2nd CAM Block; MBk and applies the pass voltage to the remaining non-selected word lines to perform the CAM data update operation. It is preferable that the GBB information GBB_info includes the information on the target block and the replacement block operation information RP_OP includes the information on the replacement block replacing the target block.

The target block MB1 is the memory block that is determined as the fail as the status check operation result of step S730 described above and determined as the GBB as the GBB check operation result of step S820 described above. Therefore, the target block MB1 may be determined as an ESF GBB, and the CAM data update operation may be performed by including information thereon in the GBB information GBB_info.

In an embodiment of the present disclosure, the GBB check operation is performed on the target block immediately after the erase operation on the target block is performed. However, the GBB check operation on the target block may be performed immediately before the erase operation on the target block is performed. That is, in the present disclosure, the GBB check operation on the target block is performed before performing the program operation on the target block. Therefore, it may be determined whether the target block is the GBB in advance before the bad block or not is determined according to the program operation result of the target block.

Figure 9:
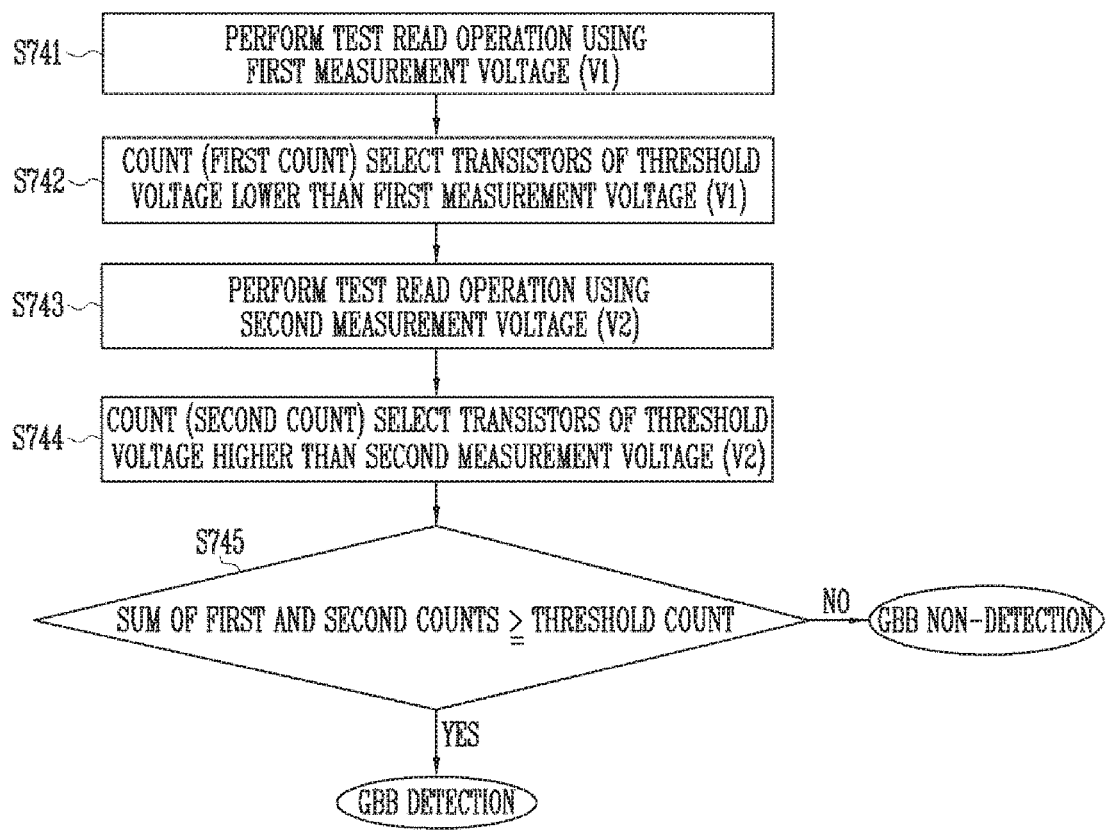
FIG. 9 is a flowchart for describing a growing bad block (GBB) check operation according to an embodiment of the present disclosure.

FIG. 9 is a flowchart for describing the GBB check operation according to an embodiment of the present disclosure.

Figure 10:
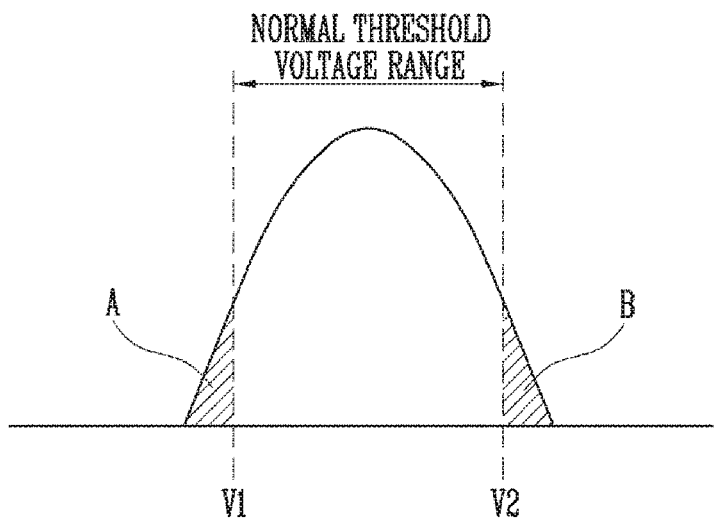
FIG. 10 is a threshold voltage distribution diagram for describing the GBB check operation of FIG. 9.

FIG. 10 is a threshold voltage distribution diagram for describing the GBB check operation of FIG. 9.

Referring to FIGS. 2, 9 and 10, the GBB check operation according to an embodiment of the present disclosure will be described as follows.

The GBB check operation according to an embodiment of the present disclosure may include steps S741 to S745.

In step S741, the peripheral circuit 200 perform a test read operation using a first measurement voltage V1 on the target block (for example, MB1).

For example, the voltage generation circuit 210 generates and outputs the first measurement voltage V1, and a row decoder 220 applies the first measurement voltage V1 to one of the select lines (drain select lines and source select lines) of the target block MB1. The page buffers PB1 to PBm of the page buffer group 230 sense the voltage or current of the corresponding bit lines BL1 to BLm to detect select transistors having a threshold voltage lower than the first measurement voltage V1 among the drain select transistors or the source select transistors connected to one select line.

Thereafter, the row decoder 220 applies the first measurement voltage V1 to a next select line, and the page buffers PB1 to PBm sense the voltage or current of the corresponding bit lines BL1 to BLm to detect the select transistors having the threshold voltage lower than the first measurement voltage V1 among the drain select transistors or the source select transistors connected to the next select line. In the method described above, the select transistors having the threshold voltage lower than the first measurement voltage V1 among the select transistors included in the target block MB1 are detected.

In step S742, the pass/fail determiner 260 counts the select transistors having the threshold voltage lower than the first measurement voltage V1 to generate the first count. For example, the pass/fail determiner 260 counts the select transistors A of the threshold voltage lower than the first measurement voltage based on the sensing voltage VPB received from the page buffer group 230 during the first test read operation of the GBB check operation to generate the first count.

In step S743, the peripheral circuit 200 perform the test read operation using a second measurement voltage V2 on the target block MB1.

For example, the voltage generation circuit 210 generates and outputs the second measurement voltage V2, and the row decoder 220 applies the second measurement voltage V2 to one of the select lines (drain select lines and source select lines) of the target block MB1. The page buffers PB1 to PBm of the page buffer group 230 sense the voltage or current of the corresponding bit lines BL1 to BLm to detect select transistors having a threshold voltage higher than the second measurement voltage V2 among the drain select transistors or the source select transistors connected to one select line.

Thereafter, the row decoder 220 applies the second measurement voltage V2 to a next select line, and the page buffers PB1 to PBm sense the voltage or current of the corresponding bit lines BL1 to BLm to detect the select transistors having the threshold voltage higher than the second measurement voltage V2 among the drain select transistors or the source select transistors connected to the next select line. In the method described above, the select transistors having the threshold voltage higher than the second measurement voltage V2 among the select transistors included in the target block MB1 are detected.

In step S744, the pass/fail determiner 260 counts the select transistors having the threshold voltage higher than the second measurement voltage V2 to generate the second count. For example, the pass/fail determiner 260 counts the select transistors B of the threshold voltage higher than the second measurement voltage based on the sensing voltage VPB received from the page buffer group 230 during the second test read operation of the GBB check operation to generate the second count.

In step S745, the sum of the first count and the second count is compared with the threshold count to determine whether the target block MB1 is a GBB detection block or a GBB non-detection block.

For example, when the sum of the first count and the second count is equal to or greater than the threshold count (Yes), the pass/fail determiner 260 generates and outputs the first fail signal 1st FAIL indicating that the target block MB1 is the GBB detection block. In addition, when the sum of the first count and the second count is less than the threshold count (No), the pass/fail determiner 260 generates and outputs the first pass signal 1st PASS indicating that the target block MB1 is the GBB non-detection block. In an embodiment, when the number of the select transistors of which the threshold voltage is out of the normal range is greater than a threshold number, the control logic determines the target block as a growing bad block, and selects a replacement block for replacing the target block from among the plurality of second replacement blocks.

The second measurement voltage V2 is a voltage higher than the first measurement voltage V1, and the first measurement voltage V1 and the second measurement voltage V2 are in the normal threshold voltage range of the select transistors.

As described above, in the GBB check operation according to an embodiment of the present disclosure, when the number of select transistors out of the normal threshold voltage range among the select transistors included in the target block is equal to or greater than a threshold value, the target block may be determined as the GBB block.

Figure 11:
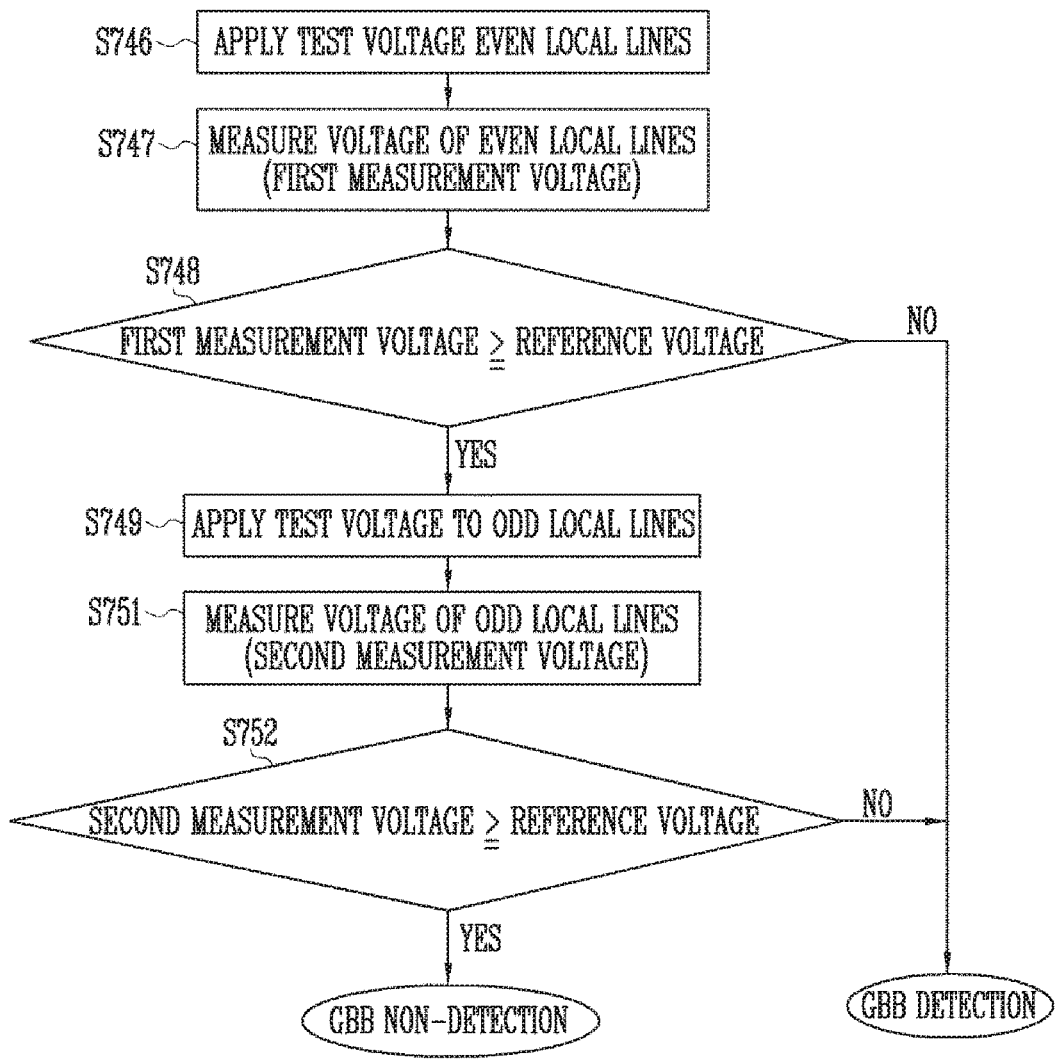
FIG. 11 is a flowchart for describing the GBB check operation according to another embodiment of the present disclosure.

FIG. 11 is a flowchart for describing the GBB check operation according to another embodiment of the present disclosure.

Figure 12:
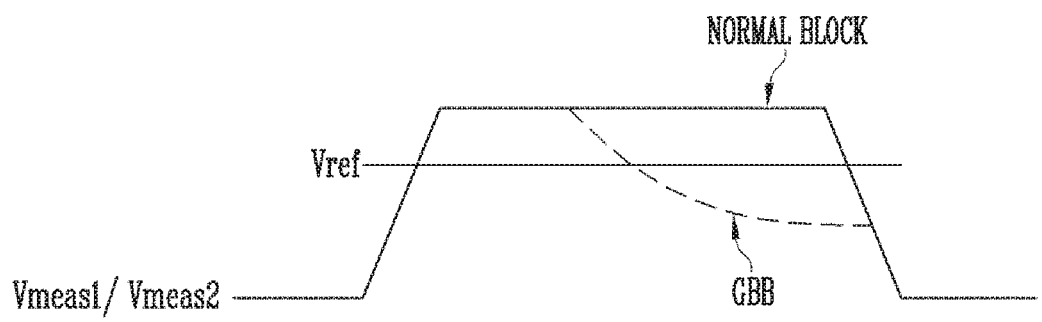
FIG. 12 is a waveform diagram of voltages for describing the GBB check operation of FIG. 11.

FIG. 12 is a waveform diagram of voltages for describing the GBB check operation of FIG. 11.

The GBB check operation according to another embodiment of the present disclosure will be described as follows with reference to FIGS. 2, 11, and 12.

The GBB check operation according to another embodiment of the present disclosure may include steps S746 to S752.

In step S746, the word line test circuit 400 applies a test voltage having a predetermined potential level to even local lines among the local lines LL connected to the target block (for example, MB1) during a predetermined time. The even local lines are local lines arranged in an even number of local lines including the plurality of select lines and the word lines sequentially arranged. The word "predetermined" as used herein with respect to a parameter, such as a predetermined time and predetermined potential level, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

In step S747, the word line test circuit 400 senses the potential of the even local lines to measure a first measurement voltage Vmeas1.

In step S748, the word line test circuit 400 compares a reference voltage Vref with the first measurement voltage Vmeas1. For example, when the first measurement voltage Vmeas1 is lower than the reference voltage Vref (No), it is determined that a defect is present in the word line of the target block MB1. Accordingly, the word line test circuit 400 generates and outputs the second fail signal 2nd FAIL indicating that the target block MB1 is the GBB detection block.

When the first measurement voltage Vmeas1 is equal to or higher than the reference voltage Vref in step S748 (Yes), in step S749, the word line test circuit 400 applies a test voltage having a predetermined potential level to odd local lines among the local lines LL connected to the target block MB1 during a predetermined time. The odd local lines are local lines arranged in an odd number of local lines including the plurality of select lines and the word lines sequentially arranged. The odd local lines and the even local lines are arranged to cross each other.

In step S751, the word line test circuit 400 senses the potential of the odd local lines to measure a second measurement voltage Vmeas2.

In step S752, the word line test circuit 400 compares the reference voltage Vref with the second measurement voltage Vmeas2. For example, when the second measurement voltage Vmeas2 is lower than the reference voltage Vref (No), it is determined that a defect is present in the word line of the target block MB1. Accordingly, the word line test circuit 400 generates and outputs the second fail signal 2nd FAIL indicating that the target block MB1 is the GBB detection block.

When the second measurement voltage Vmeas2 is equal to or higher than the reference voltage Vref (Yes), the word line test circuit 400 determines the target block MB1 as a normal block. Accordingly, the word line test circuit 400 generates and outputs the second pass signal 2nd PASS indicating that the target block MB1 is the GBB non-detection block.

As described above, in the GBB check operation according to another embodiment of the present disclosure, the target block may be determined as the GBB block by applying the test voltage to the local lines of the target block and determining that there is a defect such as a leakage current or a bridge between word lines when the measurement voltage of the local lines is lower than the reference voltage.

In the above-described embodiment, the word line test circuit 400 applies the test voltage to the local lines LL connected to the target block, and then compares the measurement voltage of the local lines LL with the reference voltage to perform the GBB check operation. However, the word line test circuit 400 may perform the GBB check operation by applying a test current to the local lines LL connected to the target block and comparing a measurement current with a reference current of the local lines LL.

Figure 13:
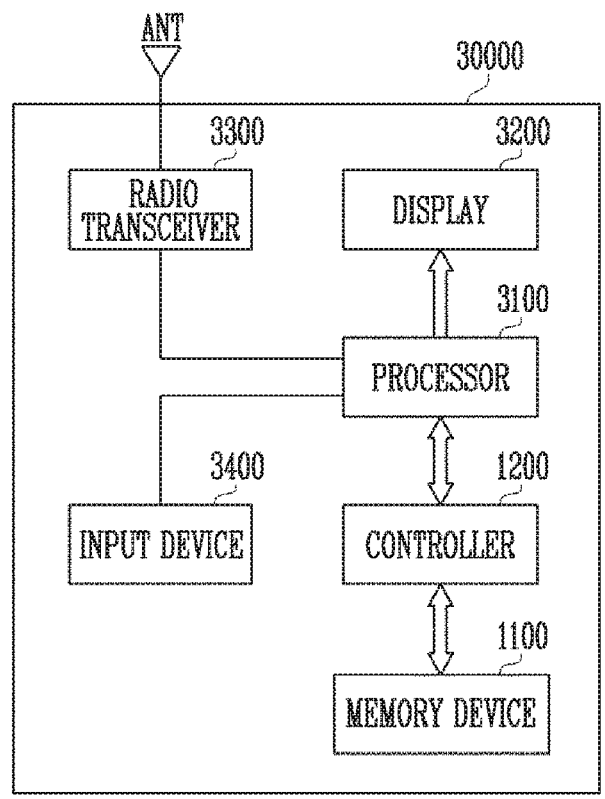
FIG. 13 is a diagram for describing another embodiment of the memory system.

FIG. 13 is a diagram for describing another embodiment of the memory system.

Referring to FIG. 13, a memory system 30000 may be implemented as a cellular phone, a smart phone, a tablet PC, a personal digital assistant (PDA) or a wireless communication device. The memory system 30000 may include the memory device 1100 and the controller 1200 capable of controlling the operation of the memory device 1100. The controller 1200 may control a data access operation, for example, a program operation, an erase operation, or a read operation, of the memory device 1100 under control of a processor 3100.

Data programmed in the memory device 1100 may be output through a display 3200 under the control of the controller 1200.

A radio transceiver 3300 may transmit and receive a radio signal through an antenna ANT. For example, the radio transceiver 3300 may convert a radio signal received through the antenna ANT into a signal that may be processed by the processor 3100. Therefore, the processor 3100 may process the signal output from the radio transceiver 3300 and transmit the processed signal to the controller 1200 or the display 3200. The controller 1200 may program the signal processed by the processor 3100 to the memory device 1100. In addition, the radio transceiver 3300 may convert a signal output from the processor 3100 into a radio signal, and output the converted radio signal to an external device through the antenna ANT. An input device 3400 may be a device capable of inputting a control signal for controlling the operation of the processor 3100 or data to be processed by the processor 3100. The input device 3400 may be implemented as a pointing device such as a touch pad or a computer mouse, a keypad, or a keyboard. The processor 3100 may control an operation of the display 3200 so that data output from the controller 1200, data output from the radio transceiver 3300, or data output from the input device 3400 is output through the display 3200.

According to an embodiment, the controller 1200 capable of controlling the operation of memory device 1100 may be implemented as a part of the processor 3100 and may also be implemented as a chip separate from the processor 3100.

Figure 14:
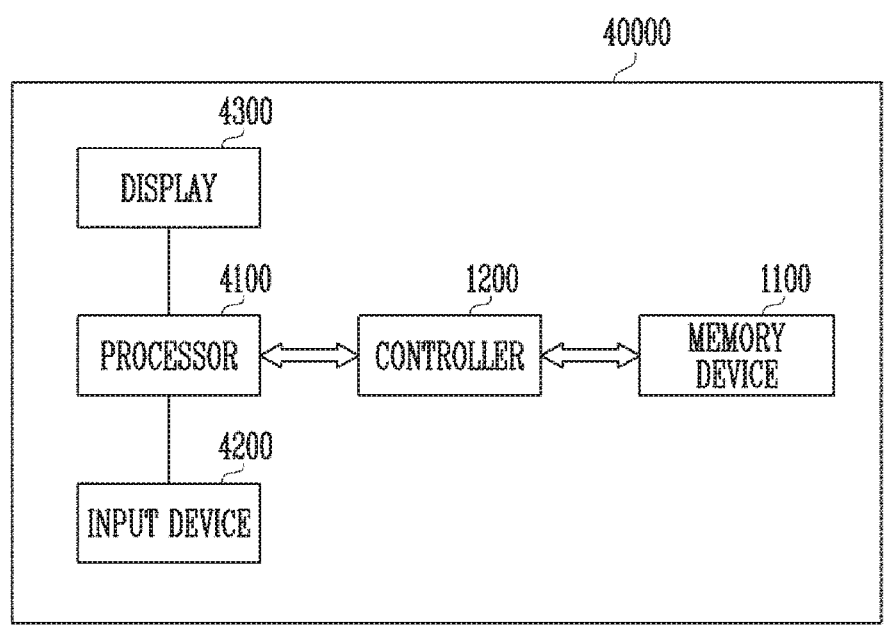
FIG. 14 is a diagram for describing another embodiment of the memory system.

FIG. 14 is a diagram for describing another example of the memory system.

Referring to FIG. 14, a memory system 40000 may be implemented as a personal computer (PC), a tablet PC, a net-book, an e-reader, a personal digital assistant (PDA), a portable multimedia player (PMP), an MP3 player, or an MP4 player.

The memory system 40000 may include the memory device 1100 and the controller 1200 capable of controlling a data process operation of the storage device 1100.

A processor 4100 may output data stored in the memory device 1100 through a display 4300, according to data input through an input device 4200. For example, the input device 4200 may be implemented as a point device such as a touch pad or a computer mouse, a keypad, or a keyboard.

The processor 4100 may control the overall operation of the memory system 40000 and control the operation of the controller 1200. According to an embodiment, the controller 1200 capable of controlling the operation of memory device 1100 may be implemented as a part of the processor 4100 or may be implemented as a chip separate from the processor 4100.

Figure 15:
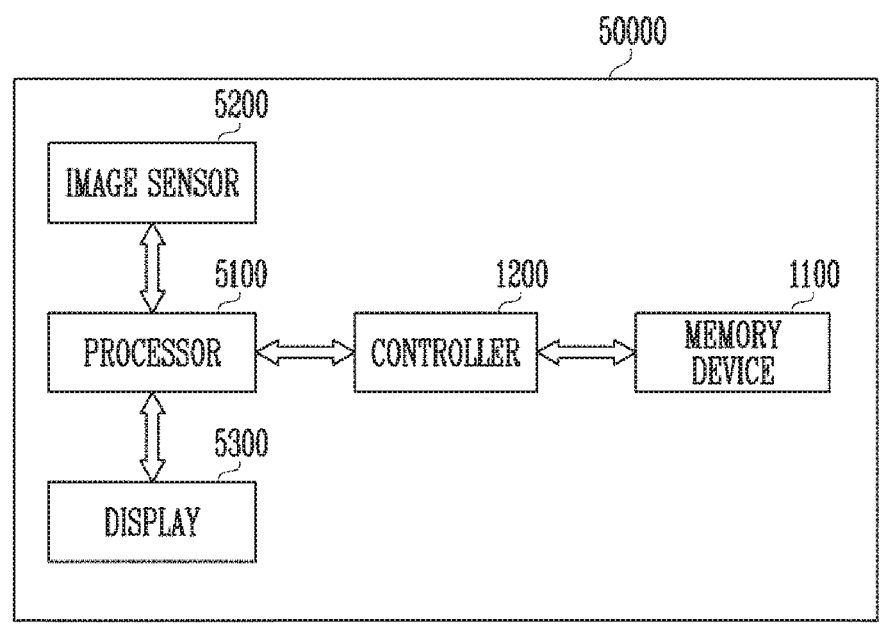
FIG. 15 is a diagram for describing another embodiment of the memory system.

FIG. 15 is a diagram for describing another embodiment of the memory system.

Referring to FIG. 15, a memory system 50000 may be implemented as an image processing device, for example, a digital camera, a portable phone provided with a digital camera, a smart phone provided with a digital camera, or a tablet PC provided with a digital camera.

The memory system 50000 includes the memory device 1100 and the controller 1200 capable of controlling a data process operation, for example, a program operation, an erase operation, or a read operation, of the memory device 1100.

An image sensor 5200 of the memory system 50000 may convert an optical image into digital signals. The converted digital signals may be transmitted to a processor 5100 or the controller 1200. Under control of the processor 5100, the converted digital signals may be output through a display 5300 or stored in the memory device 1100 through the controller 1200. In addition, data stored in the memory device 1100 may be output through the display 5300 under the control of the processor 5100 or the controller 1200.

According to an embodiment, the controller 1200 capable of controlling the operation of memory device 1100 may be implemented as a part of the processor 5100 or may be implemented as a chip separate from the processor 5100.

Figure 16:
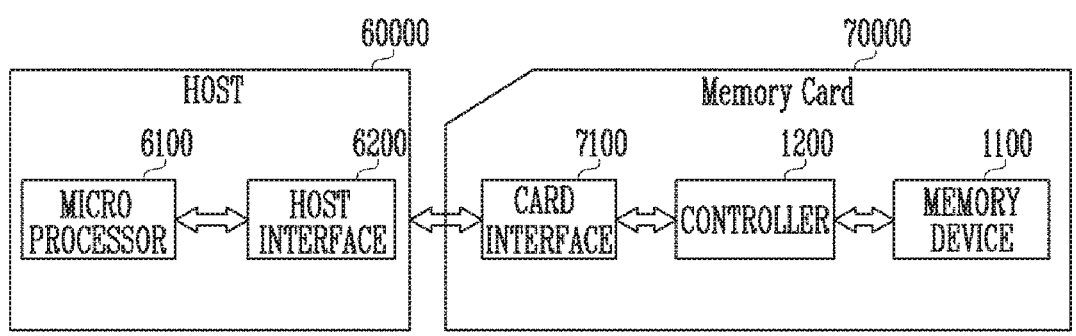
FIG. 16 is a diagram for describing another embodiment of the memory system.

FIG. 16 is a diagram for describing another embodiment of the memory system.

Referring to FIG. 16, a memory system 70000 may be implemented as a memory card or a smart card. The memory system 70000 may include the memory device 1100, the controller 1200, and a card interface 7100.

The controller 1200 may control data exchange between the memory device 1100 and the card interface 7100. According to an embodiment, the card interface 7100 may be a secure digital (SD) card interface or a multi-media card (MMC) interface, but is not limited thereto. In addition, the controller 1200 may be implemented through an example of the controller 1200 shown in FIG. 2.

The card interface 7100 may interface data exchange between a host 60000 and the controller 1200 according to a protocol of the host 60000. According to an embodiment, the card interface 7100 may support a universal serial bus (USB) protocol, and an interchip (IC)-USB protocol. Here, the card interface may refer to hardware capable of supporting a protocol that is used by the host 60000, software installed in the hardware, or a signal transmission method.

When the memory system 70000 is connected to a host interface 6200 of the host 60000 such as a PC, a tablet PC, a digital camera, a digital audio player, a mobile phone, a console video game hardware, or a digital set-top box, the interface 6200 may perform data communication with the memory device 1100 through the card interface 7100 and the controller 1200 under control of a microprocessor 6100.

Although the detailed description of the present disclosure describes examples of embodiments, various changes and modifications may be made without departing from the scope and technical spirit of the present disclosure. Therefore, the scope of the present disclosure should not be limited to the above-described embodiments, and should be determined by the equivalents of the claims of the present disclosure as well as the following claims.

What is claimed is:

1. A semiconductor memory device comprising:
a memory cell array including a plurality of memory blocks, which are assigned as a plurality of normal blocks, a plurality of first replacement blocks, a plurality of second replacement blocks, a first content addressable memory (CAM) block, and a second CAM block;
a peripheral circuit configured to perform an erase operation and a program operation on the plurality of memory blocks; and
control logic configured to control the peripheral circuit to perform a growing bad block check operation on a target block during the program operation on a selected target block among the normal memory blocks,
wherein the control logic controls the peripheral circuit to perform the erase operation on the target block before performing the program operation on the target block, and perform the growing bad block check operation immediately before the erase operation or perform the growing bad block check operation immediately after performing the erase operation.

2. The semiconductor memory device of claim 1, wherein the peripheral circuit checks threshold voltages of select transistors included in the target block during the growing bad block check operation, and counts the number of select transistors of which the threshold voltage is out of a normal range among the select transistors.

3. The semiconductor memory device of claim 2, wherein when the number of the select transistors of which the threshold voltages are out of the normal range is greater than a threshold count, the control logic determines the target block as a growing bad block, and selects a replacement block for replacing the target block from among the plurality of second replacement blocks.

4. The semiconductor memory device of claim 3, wherein the control logic controls the peripheral circuit to perform the program operation on the selected replacement block.

5. The semiconductor memory device of claim 4, wherein the control logic controls the peripheral circuit to update information on the target block and the selected replacement block in the second CAM block after the program operation on the selected replacement block is completed.

6. The semiconductor memory device of claim 1, wherein the first replacement blocks are memory blocks for replacing memory blocks determined as initial bad blocks among the normal blocks.

7. The semiconductor memory device of claim 6, wherein each of the initial bad blocks is a bad memory block detected during a test process after manufacturing of the semiconductor memory device is completed.

8. The semiconductor memory device of claim 6, wherein the first CAM block stores system data including option parameter information and information on operation voltages and information on the initial bad blocks.

9. The semiconductor memory device of claim 1, further comprising:
a word line test circuit configured to detect a defect of local lines connected to the target blocks during the growing bad block check operation.

10. A semiconductor memory device comprising:
a memory cell array including a plurality of normal blocks, a plurality of replacement blocks, and a CAM block;
a peripheral circuit configured to perform an erase operation and a program operation on the plurality of memory blocks;
a word line test circuit coupled to the plurality of memory blocks through local lines and configured to detect a defect in a memory block from the plurality of memory blocks through the local lines; and
control logic configured to control the peripheral circuit to perform a growing bad block check operation on the target block during the program operation on a selected target block among the normal memory blocks,
wherein the control logic controls the peripheral circuit to perform the program operation on a selected replacement block among the plurality of replacement blocks instead of the target block according to a result of the growing bad block check operation,
wherein the control logic controls the peripheral circuit to perform the erase operation on the target block during the program operation on the target block, and perform the growing bad block check operation before the erase operation or perform the growing bad block check operation after performing the erase operation.

11. The semiconductor memory device of claim 10, wherein the peripheral circuit checks threshold voltages of select transistors included in the target block during the growing bad block check operation, and counts the number of select transistors of which the threshold voltages are out of a normal range among the select transistors.

12. The semiconductor memory device of claim 10, wherein the word line test circuit applies a test voltage to the local lines during the growing bad block check operation, and compares a measured voltage and a reference voltage of the local lines to detect the defect of the target block.

13. A method of operating a semiconductor memory device comprising:
receiving a command corresponding to a program operation on a target block;
performing a growing bad block check operation on the target block before an erase operation;
performing the erase operation on the target block immediately after the growing bad block check operation in response to the command; and
selecting a replacement block for replacing the target block and performing the program operation when the target block is determined as a growing bad block as a result of the growing bad block check operation.

14. The method of claim 13, further comprising:
storing information on the target block and information on the replacement block in a CAM block after the program operation on the replacement block is completed.

15. The method of claim 13, wherein the growing bad block check operation compares the number of select transistors out of a normal threshold voltage range among select transistors included in the target block.

16. The method of claim 13, wherein the growing bad block check operation applies a test voltage to local lines of the target block and compares a measured voltage and a reference voltage of the local lines.

* * * * *